(12) United States Patent
Tsai

(10) Patent No.: US 12,125,886 B2
(45) Date of Patent: Oct. 22, 2024

(54) FIN FIELD-EFFECT TRANSISTOR DEVICE AND METHOD

(71) Applicant: Taiwan Semiconductor Manufacturing Co., Ltd., Hsinchu (TW)

(72) Inventor: Ming-Huan Tsai, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 172 days.

(21) Appl. No.: 17/320,971

(22) Filed: May 14, 2021

(65) Prior Publication Data

US 2022/0293742 A1  Sep. 15, 2022

Related U.S. Application Data

(60) Provisional application No. 63/159,001, filed on Mar. 10, 2021.

(51) Int. Cl.
| | |
|---|---|
| H01L 29/40 | (2006.01) |
| H01L 21/28 | (2006.01) |
| H01L 21/285 | (2006.01) |
| H01L 29/41 | (2006.01) |
| H01L 29/417 | (2006.01) |
| H01L 29/45 | (2006.01) |
| H01L 29/66 | (2006.01) |
| H01L 29/78 | (2006.01) |

(52) U.S. Cl.
CPC ...... *H01L 29/401* (2013.01); *H01L 21/28518* (2013.01); *H01L 29/41791* (2013.01); *H01L 29/45* (2013.01); *H01L 29/66545* (2013.01); *H01L 29/66795* (2013.01); *H01L 29/7851* (2013.01)

(58) Field of Classification Search
CPC .......... H01L 29/401; H01L 21/823431; H01L 29/41791; H01L 29/66795; H01L 29/7851; H01L 27/0886; H01L 21/823475; H01L 21/823871
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |

(Continued)

*Primary Examiner* — Vu A Vu
*Assistant Examiner* — Valerie N Newton
(74) *Attorney, Agent, or Firm* — Slater Matsil, LLP

(57) ABSTRACT

A method of forming a semiconductor device includes: forming a metal gate structure over a fin that protrudes above a substrate, where the metal gate structure is surrounded by an interlayer dielectric (ILD) layer, where gate spacers extend along opposing sidewalls of the metal gate structure; recessing the metal gate structure and the gate spacers below an upper surface of the ILD layer distal from the substrate; after the recessing, forming a first material over the metal gate structure and over the gate spacers; forming a second material over the first material, where an upper surface of the second material is level with the upper surface of the ILD layer; and removing a first portion of the ILD layer adjacent to the metal gate structure to form an opening that exposes a source/drain region at a first side of the metal gate structure.

20 Claims, 34 Drawing Sheets

(56) References Cited

U.S. PATENT DOCUMENTS

| | | |
|---|---|---|
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,431,495 B1* | 10/2019 | Cheng .............. H01L 21/76895 |
| 2015/0035086 A1 | 2/2015 | Xie et al. |
| 2015/0041869 A1 | 2/2015 | Pham et al. |
| 2017/0077247 A1 | 3/2017 | Xie et al. |
| 2017/0117380 A1 | 4/2017 | Lu et al. |
| 2019/0140062 A1* | 5/2019 | You ....................... H01L 29/785 |
| 2019/0378722 A1 | 12/2019 | Economikos et al. |
| 2020/0043732 A1 | 2/2020 | Chiang et al. |
| 2020/0044072 A1* | 2/2020 | Chiang ............. H01L 29/66795 |
| 2020/0091345 A1* | 3/2020 | Chiu ................... H01L 29/7851 |
| 2020/0105931 A1* | 4/2020 | Wu .................... H01L 29/66795 |
| 2020/0126843 A1 | 4/2020 | Tsai et al. |
| 2020/0243385 A1* | 7/2020 | Huang .............. H01L 21/76877 |
| 2020/0312994 A1* | 10/2020 | You ....................... H01L 29/401 |
| 2020/0335337 A1* | 10/2020 | Chiang .............. H01L 21/0332 |

\* cited by examiner

FIN FIELD-EFFECT TRANSISTOR DEVICE AND METHOD

PRIORITY CLAIM AND CROSS-REFERENCE

This application claims priority to U.S. Provisional Patent Application No. 63/159,001, filed Mar. 10, 2021, entitled "Scheme for MD SAC & Vc Dual SAC," which application is hereby incorporated by reference in its entirety BACKGROUND The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a semiconductor device, and in particular, in the context of forming self-aligned contacts for a Fin Field-Effect Transistor (FinFET) device. The principle of the disclosed embodiments may also be applied to other types of devices, such as planar devices.

In accordance with an embodiment of the present disclosure, a bi-layered helmet, which comprises two different layers of non-conductive materials, is formed over a metal gate structure, where the metal gate structure is surrounded by an inter-layer dielectric (ILD) layer. In a subsequent etching process to form a source/drain contact hole in the ILD layer next to the metal gate structure, the bi-layered helmet provides excellent etching selectivity between the material of the ILD layer and the materials of the bi-layered helmets, thus preventing the "shoulder loss" problem, which refers to the problem that materials of other structures (e.g., gate spacers) near the shoulders (e.g., top corners) of the metal gate structure are etched away by the etching process. Since the "shoulder loss" problem may cause electrical short between the metal gate structure and the adjacent source/drain region, the disclosed embodiment prevents or reduces product defect caused by the "shoulder loss" problem.

Figure 1:
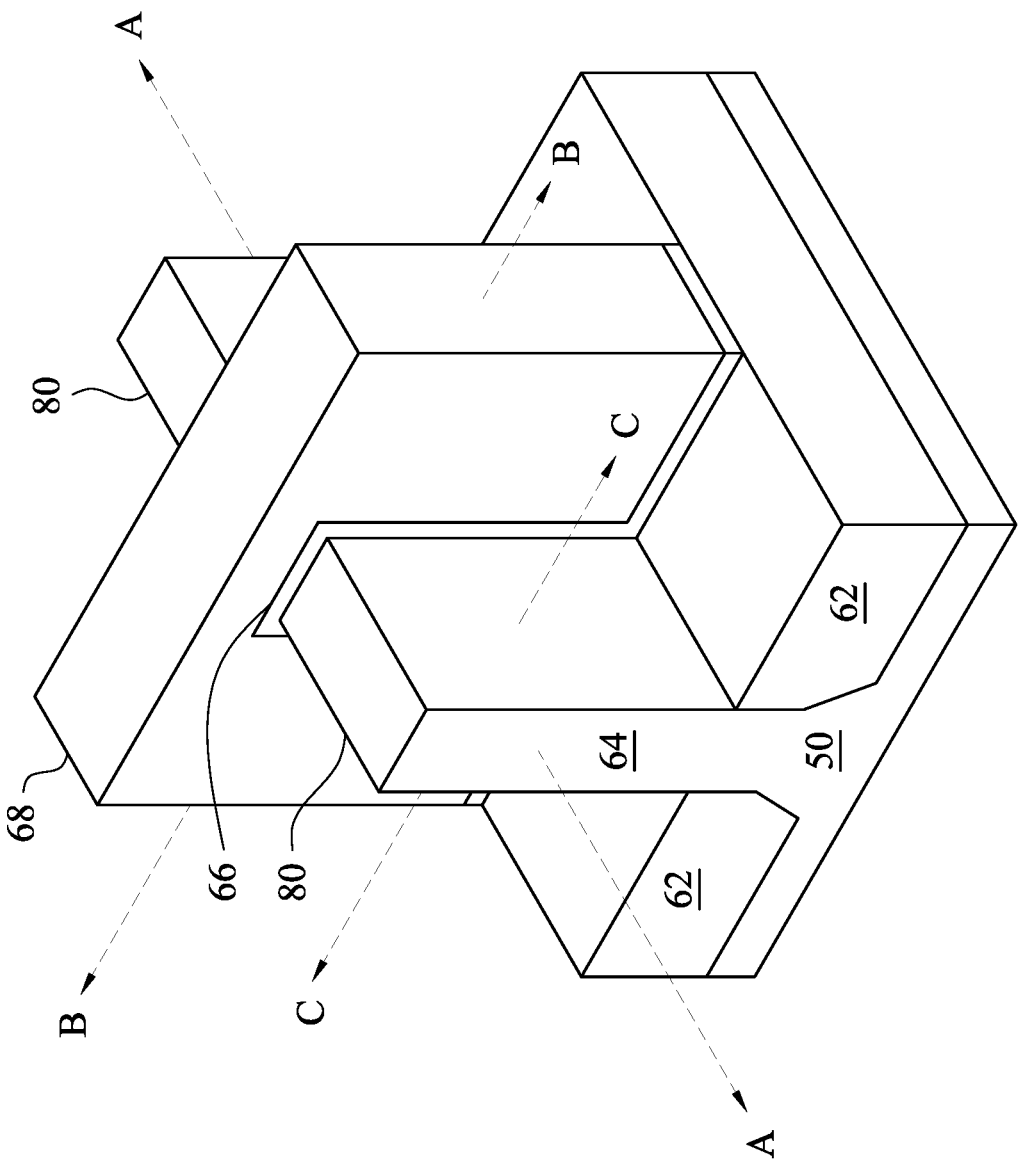
FIG. 1 is a perspective view of a Fin Field-Effect Transistor (FinFET), in accordance with some embodiments.

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate electrode 68 is over the gate dielectric 66. Source/drain regions 80 are in the fin 64 and on opposing sides of the gate dielectric 66 and the gate electrode 68. FIG. 1 further illustrates reference cross-sections that are used in later figures. Cross-section B-B extends along a longitudinal axis of the gate electrode 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Subsequent figures refer to these reference cross-sections for clarity.

FIGS. 2-16, 17A, 17B, 18A, 18B, 19A, 19B, 20A, 20B, 21A, 21B, 22, 23A, 23B, and 24-27 illustrate various views (e.g., cross-sectional view, top view) of a FinFET device 100 at various stages of fabrication, in accordance with an embodiment. The FinFET device 100 is similar to the FinFET 30 in FIG. 1, except for multiple fins and multiple gate structures. FIGS. 2-5 illustrate cross-sectional views of the FinFET device 100 along cross-section B-B, and FIGS. 6-16, 17A, 18A, 19A, 20A, 21A, 22, 23A, and 24-27 illustrate cross-sectional views of the FinFET device 100 along cross-section A-A. FIGS. 17B, 18B, 19B, 20B, and 21B illustrate cross-sectional views of the FinFET device 100 along cross-section C-C. FIG. 23B illustrates a top view of the FinFET device 100. Throughout the discussion herein, figures with the same numeral but different letters (e.g., 17A and 17B) illustrate different views (e.g., along different cross-sections) of the FinFET device 100 at the same stage of processing.

Figure 2:
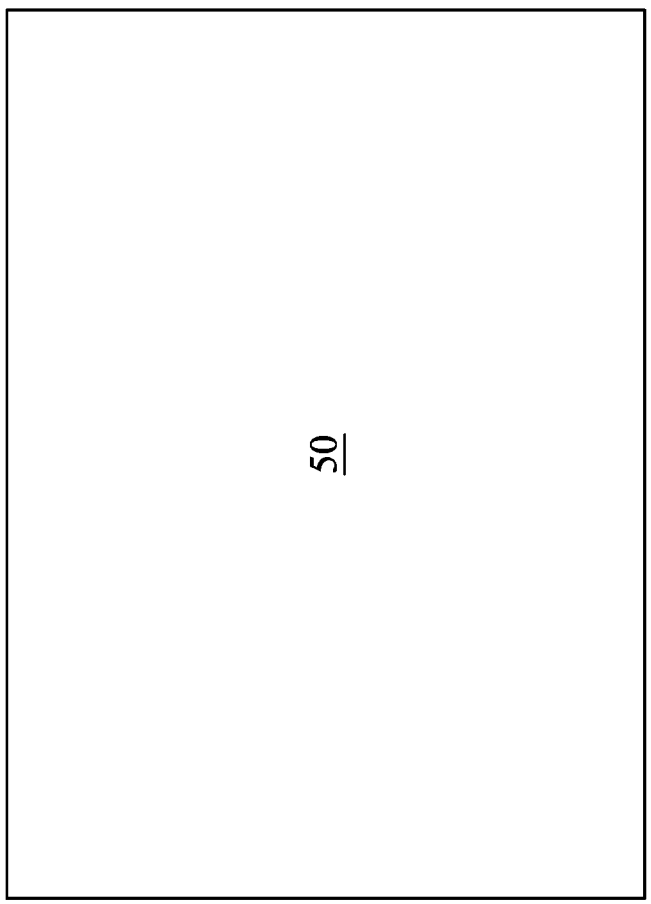
FIGS. 2-16, 17A, 17B, 18A, 18B, 19A, 19B, 20A, 20B, 21A, 21B, 22, 23A, 23B, and 24-27 illustrate various views of a FinFET device at various stages of fabrication, in accordance with an embodiment.

FIG. 2 illustrates a cross-sectional view of a substrate 50. The substrate 50 may be a semiconductor substrate, such as a bulk semiconductor, a semiconductor-on-insulator (SOI)

substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
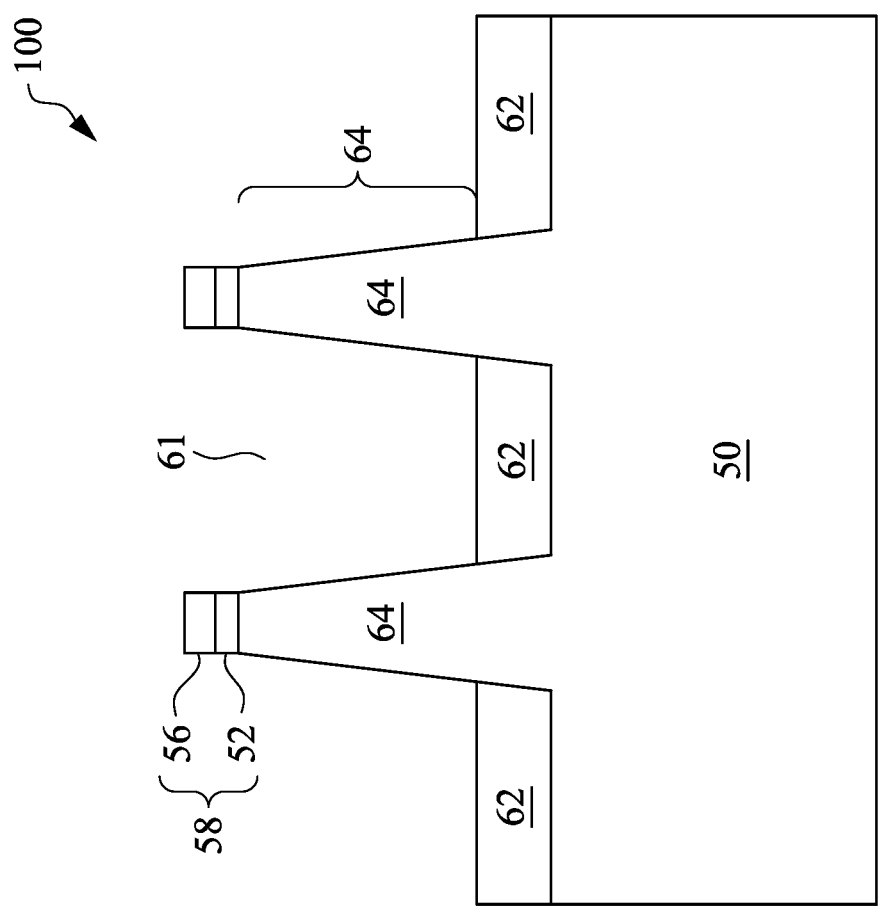

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56 and may act as an etch stop layer for etching the pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etch may be anisotropic. In some embodiments, the trenches 61 may be strips (viewed from in the top) parallel to each other, and closely spaced with respect to each other. In some embodiments, the trenches 61 may be continuous and surround the semiconductor fins 64. The semiconductor fins 64 may also be referred to as fins 64 hereinafter.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
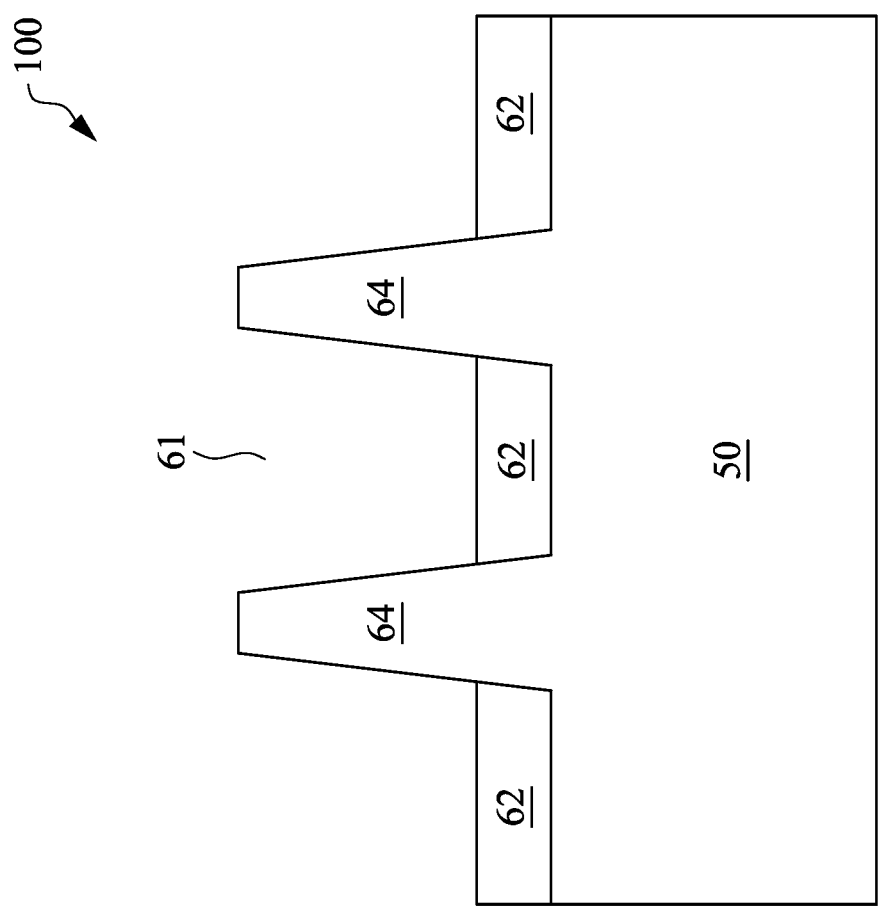

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a dry etch, or a wet etch using dilute hydrofluoric (dHF) acid, may be performed to recess the isolation regions 62.

FIGS. 2 through 4 illustrate an embodiment of forming fins 64, but fins may be formed in various different processes. For example, a top portion of the substrate 50 may be replaced by a suitable material, such as an epitaxial material suitable for an intended type (e.g., n-type or p-type) of semiconductor devices to be formed. Thereafter, the substrate 50, with epitaxial material on top, is patterned to form semiconductor fins 64 that comprise the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 64 may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
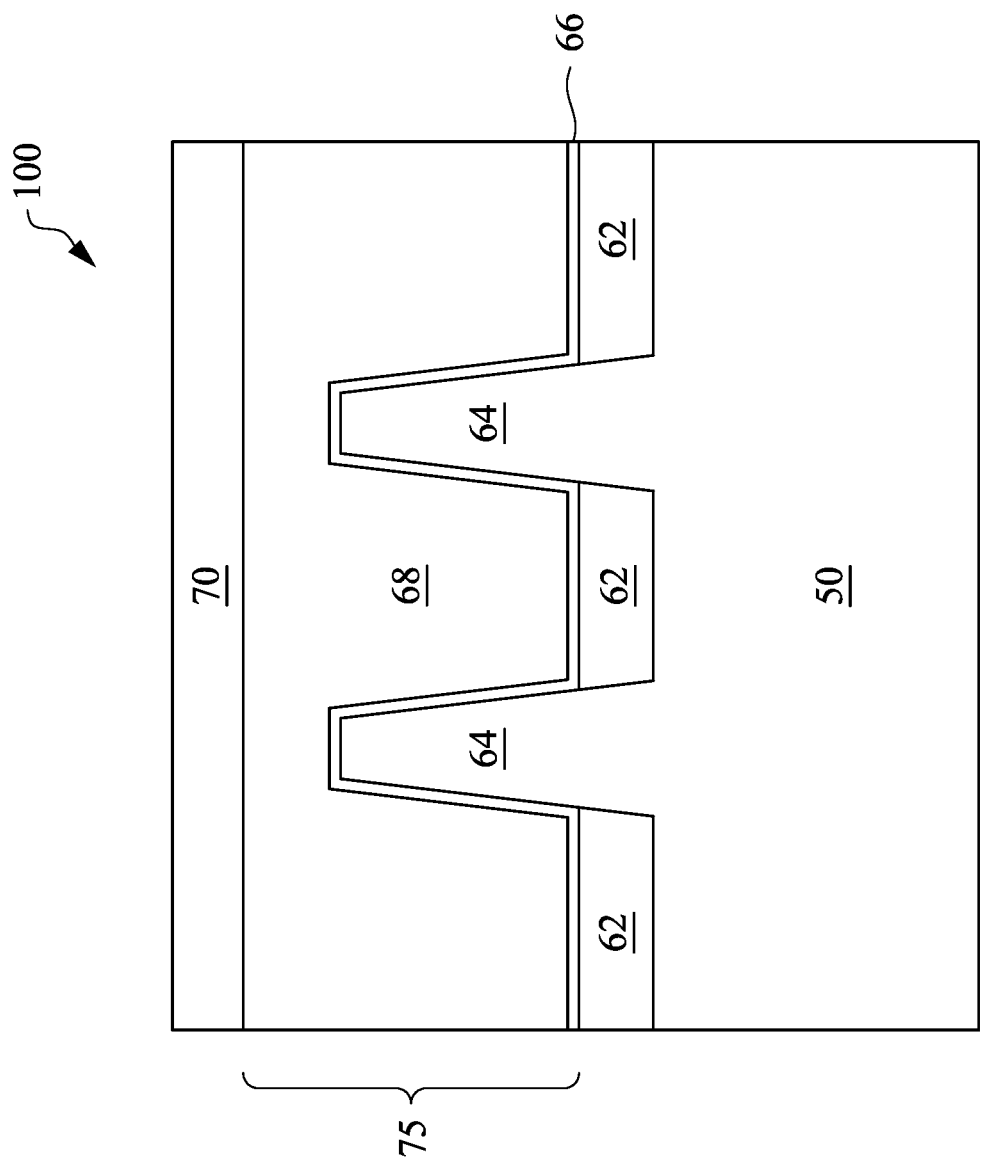

FIG. 5 illustrates the formation of dummy gate structure 75 over the semiconductor fins 64. Dummy gate structure 75 includes gate dielectric 66 and gate electrode 68, in some embodiments. A mask 70 may be formed over the dummy gate structure 75. To form the dummy gate structure 75, a dielectric layer is formed on the semiconductor fins 64. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate electrode 68 and gate dielectric 66, respectively. The gate electrode 68 and the gate dielectric 66 cover respective channel regions of the semiconductor fins 64. The gate electrode 68 may also have a lengthwise direction substantially perpendicular to the lengthwise direction of respective semiconductor fins 64.

The gate dielectric 66 is shown to be formed over the fins 64 (e.g., over top surfaces and sidewalls of the fins 64) and over the STI regions 62 in the example of FIG. 5. In other embodiments, the gate dielectric 66 may be formed by, e.g., thermal oxidization of a material of the fins 64, and therefore, may be formed over the fins 64 but not over the STI regions 62. These and other variations are fully intended to be included within the scope of the present disclosure.

Figure 6:
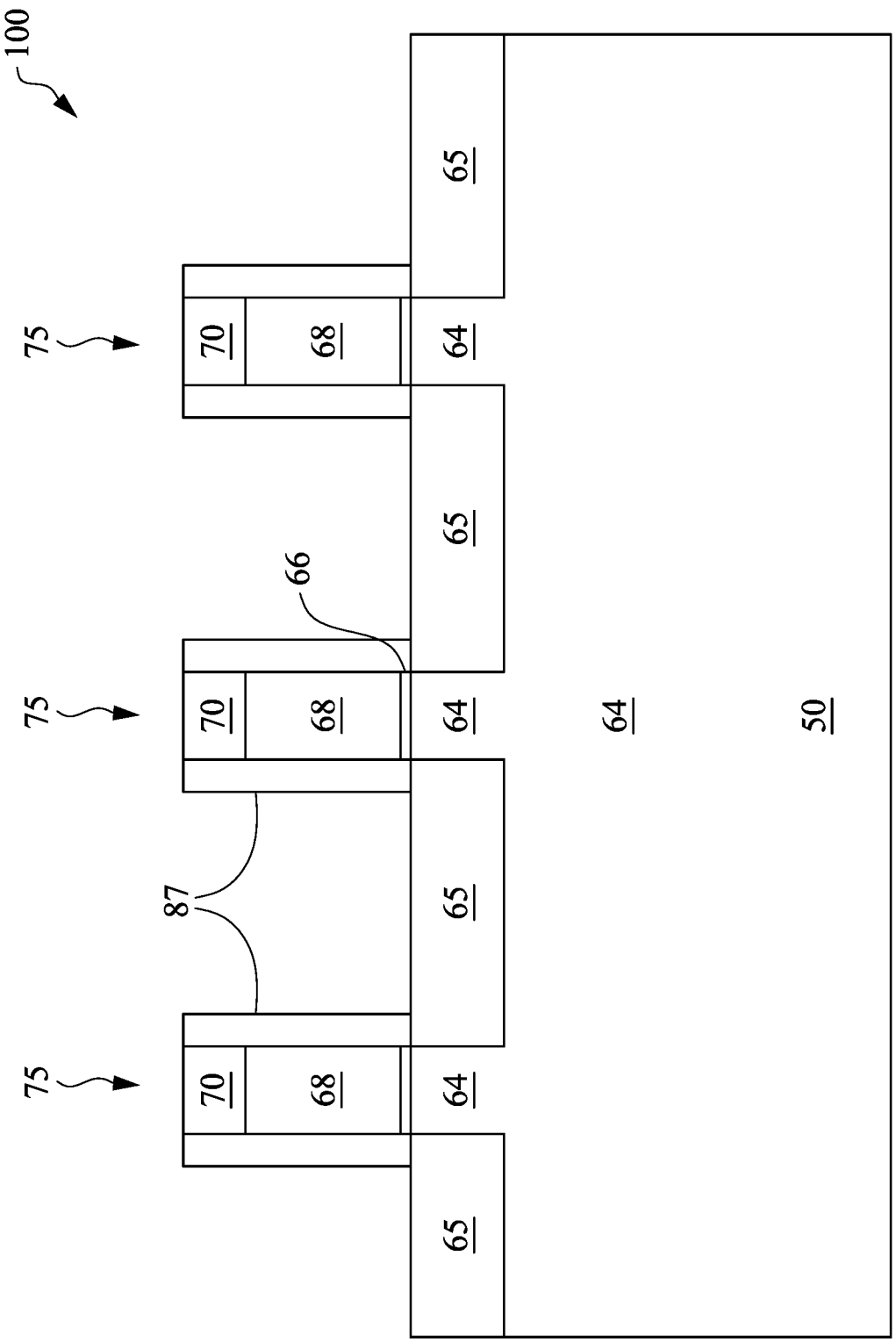

Next, as illustrated in FIG. 6, lightly doped drain (LDD) regions 65 are formed in the fins 64. The LDD regions 65 may be formed by an implantation process. The implantation process may implant n-type or p-type impurities in the fins 64 to form the LDD regions 65. In some embodiments, the LDD regions 65 abut the channel region of the FinFET device 100. Portions of the LDD regions 65 may extend under gate electrode 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87 are formed.

Still referring to FIG. 6, after the LDD regions 65 are formed, gate spacers 87 are formed on the gate structure. In the example of FIG. 6, the gate spacers 87 are formed on opposing sidewalls of the gate electrode 68 and on opposing sidewalls of the gate dielectric 66. The gate spacers 87 may be formed of silicon nitride, silicon oxynitride, silicon carbide, silicon carbonitride, the like, or a combination thereof, and may be formed using, e.g., a thermal oxidation, CVD, or other suitable deposition process.

The shapes and formation methods of the gate spacers 87 as illustrated in FIG. 6 are merely non-limiting examples, and other shapes and formation methods are possible. For example, the gate spacers 87 may include first gate spacers (not shown) and second gate spacers (not shown). The first gate spacers may be formed on the opposing sidewalls of the dummy gate structure 75. The second gate spacers may be formed on the first gate spacers, with the first gate spacers disposed between a respective gate structure and the respective second gate spacers. The first gate spacers may have an L-shape in a cross-sectional view. As another example, the gate spacers 87 may be formed after the epitaxial source/drain regions 80 (see FIG. 7) are formed. In some embodiments, dummy gate spacers are formed on the first gate spacers (not shown) before the epitaxial process of the epitaxial source/drain regions 80 illustrated in FIG. 7, and the dummy gate spacers are removed and replaced with the second gate spacers after the epitaxial source/drain regions 80 are formed. All such embodiments are fully intended to be included in the scope of the present disclosure.

Figure 7:
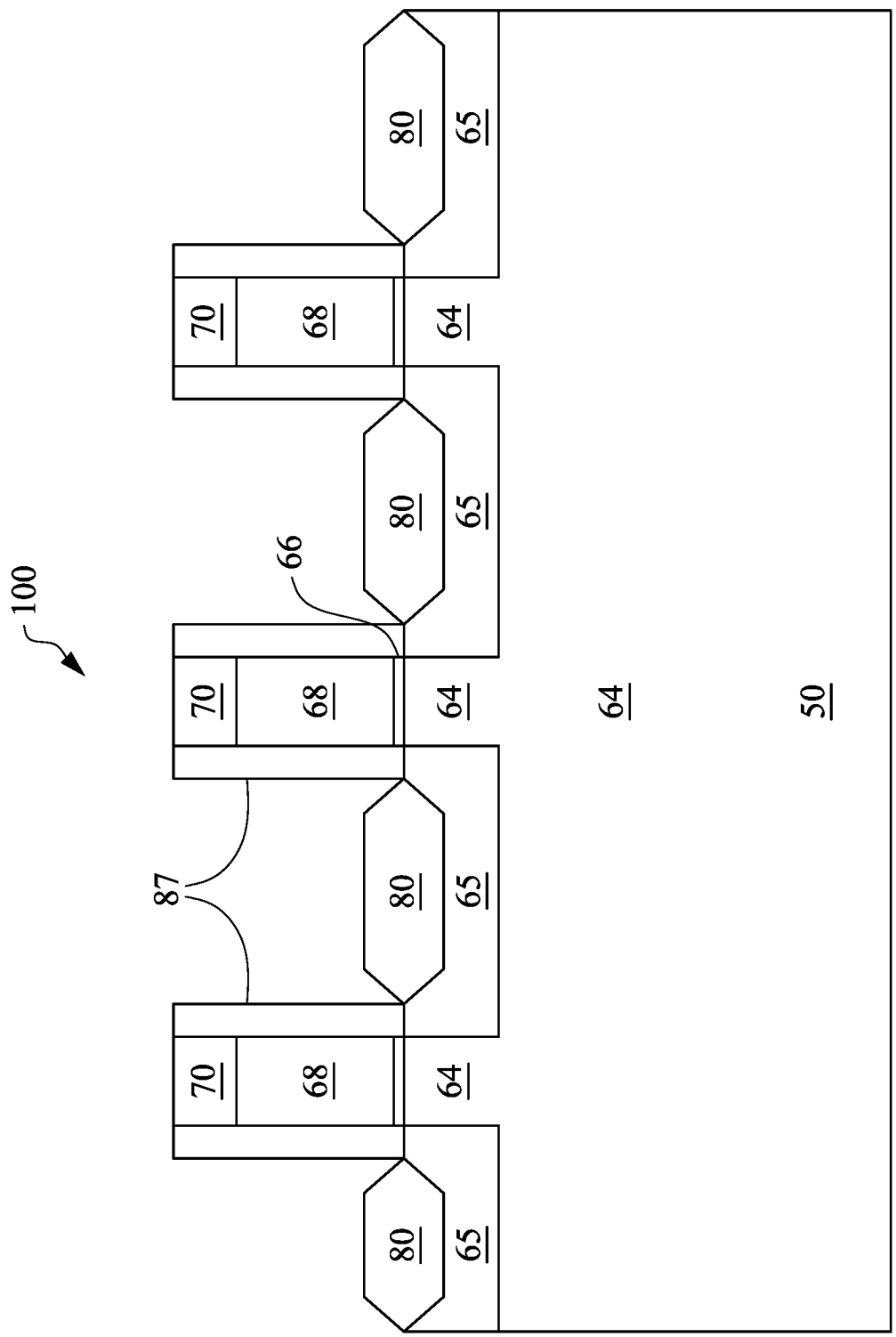

Next, as illustrated in FIG. 7, source/drain regions 80 are formed. The source/drain regions 80 are formed by etching the fins 64 to form recesses, and epitaxially growing a material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 7, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80. In some embodiments, the source/drain regions 80 of adjacent fins 64 do not merge together and remain separate source/drain regions 80. In some example embodiments in which the resulting FinFET is an n-type FinFET, source/drain regions 80 comprise silicon carbide (SiC), silicon phosphorous (SiP), phosphorous-doped silicon carbon (SiCP), or the like. In alternative exemplary embodiments in which the resulting FinFET is a p-type FinFET, source/drain regions 80 comprise SiGe, and a p-type impurity such as boron or indium.

The epitaxial source/drain regions 80 may be implanted with dopants to form source/drain regions 80 followed by an anneal process. The implanting process may include forming and patterning masks such as a photoresist to cover the regions of the FinFET that are to be protected from the implanting process. The source/drain regions 80 may have an impurity (e.g., dopant) concentration in a range from about $1E19$ $cm^{-3}$ to about $1E21$ $cm^{-3}$. In some embodiments, the epitaxial source/drain regions may be in situ doped during growth.

Figure 8:
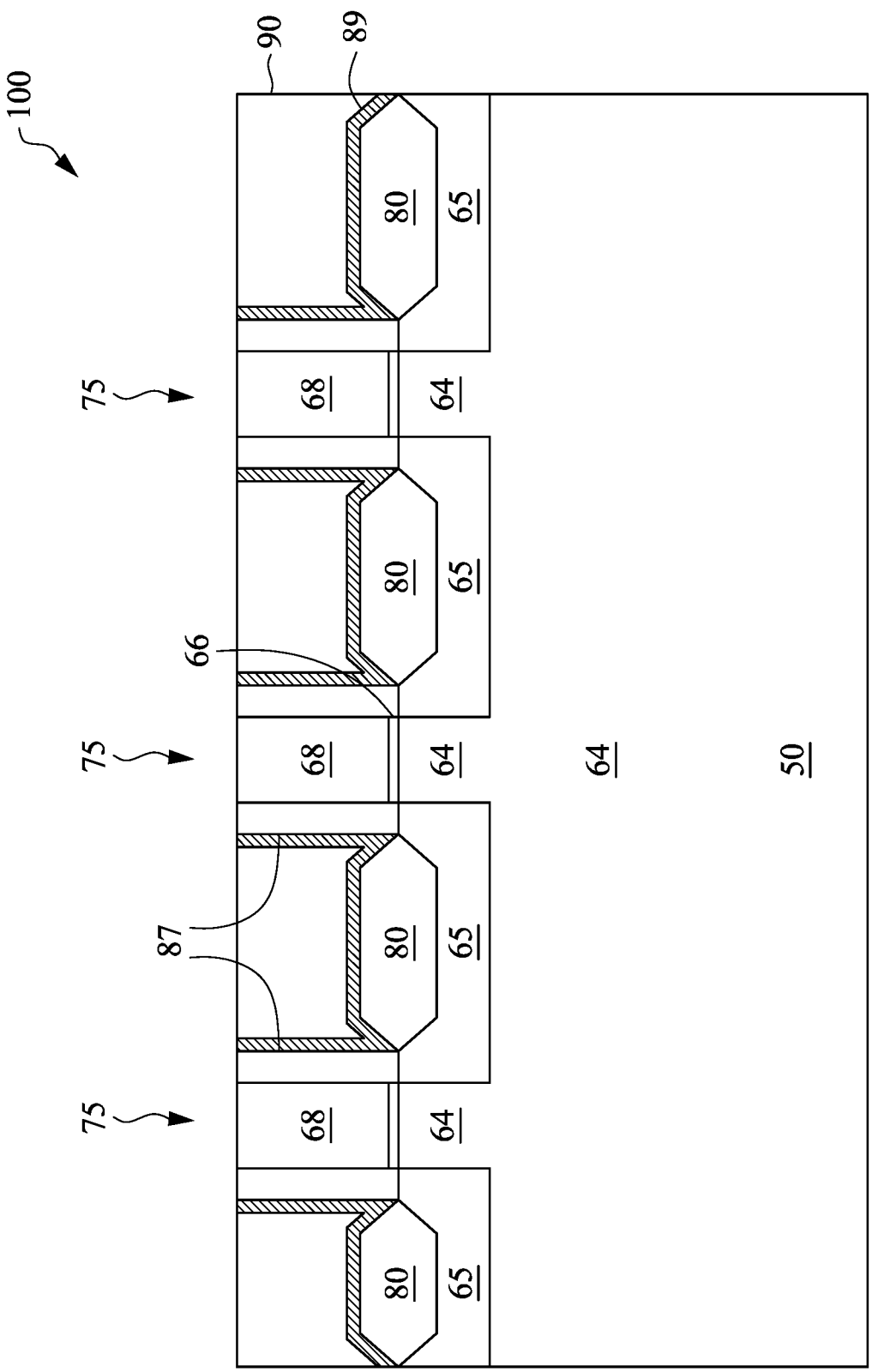

Next, as illustrated in FIG. 8, a contact etch stop layer (CESL) 89 is formed over the structure illustrated in FIG. 7. The CESL 89 functions as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, a first interlayer dielectric (ILD) 90 is formed over the CESL 89 and over the dummy gate structures 75. In some embodiments, the first ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as CMP, may be performed to remove the mask 70 and to remove portions of the CESL 89 disposed over the gate electrode 68. After the planarization process, the top surface of the first ILD 90 is level with the top surface of the gate electrode 68.

Figure 9:
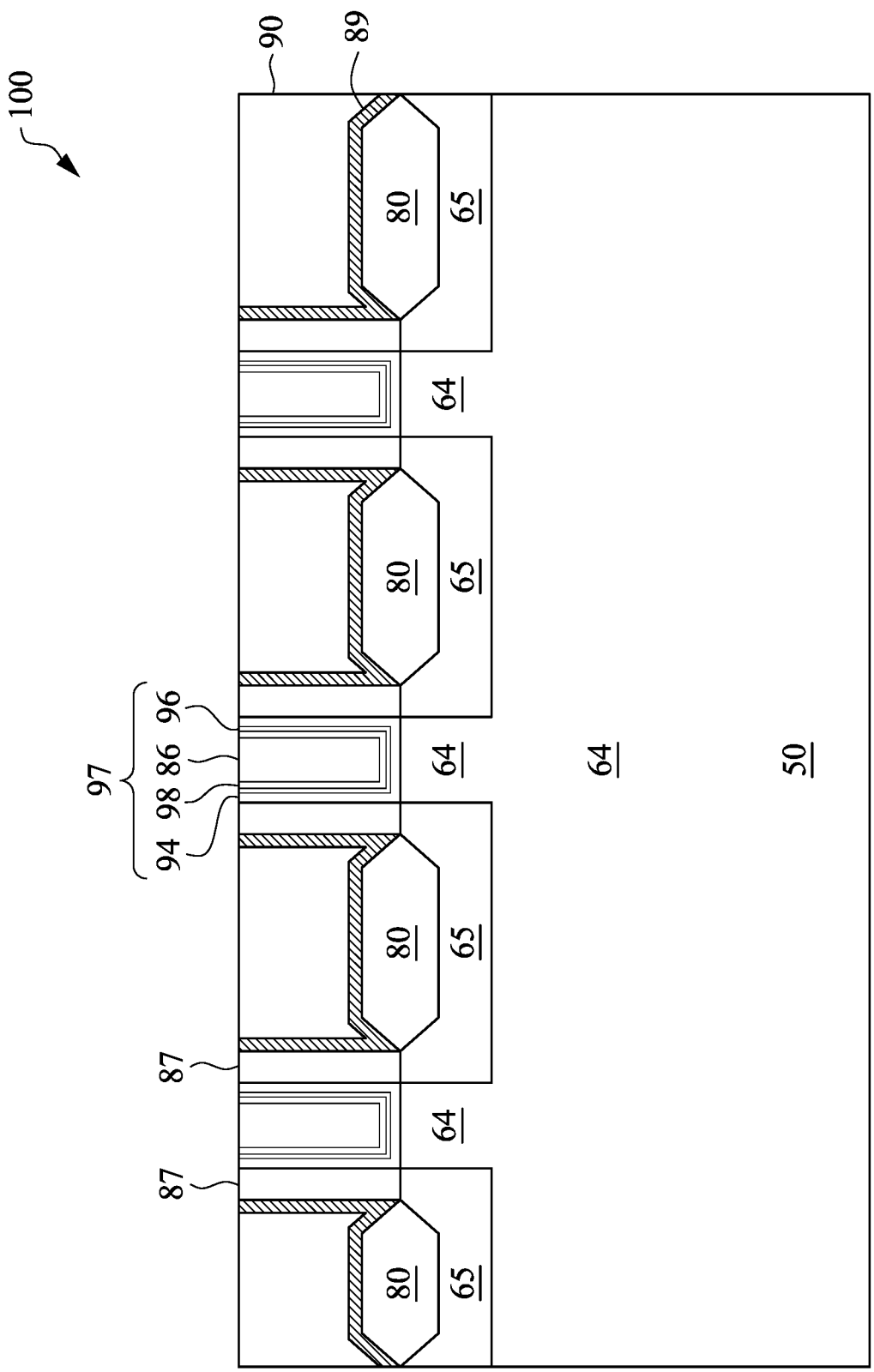

Next, in FIG. 9, a gate-last process (sometimes referred to as replacement gate process) is performed to replace the gate electrode 68 and the gate dielectric 66 with an active gate (may also be referred to as a replacement gate or a metal gate) and active gate dielectric material(s), respectively. Therefore, the gate electrode 68 and the gate dielectric 66 may be referred to as dummy gate electrode and dummy gate dielectric, respectively, in a gate-last process. The active gate is a metal gate, in some embodiments.

Referring to FIG. 9, the dummy gate structures 75 are replaced by replacement gate structures 97. In accordance with some embodiments, to form the replacement gate structures 97, the gate electrode 68 and the gate dielectric 66 directly under the gate electrode 68 are removed in an etching step(s), so that recesses (not shown) are formed between the gate spacers 87. Each recess exposes the channel region of a respective fin 64. During the dummy gate removal, the gate dielectric 66 may be used as an etch stop layer when the gate electrode 68 is etched. The gate dielectric 66 may then be removed after the removal of the gate electrode 68.

Next, a gate dielectric layer 94, a barrier layer 96, a work function layer 98, and a gate electrode 86 are formed in the recesses for the replacement gate structure 97. The gate dielectric layer 94 is deposited conformally in the recesses, such as on the top surfaces and the sidewalls of the fins 64 and on sidewalls of the gate spacers 87, and on a top surface of the first ILD 90 (not shown). In accordance with some embodiments, the gate dielectric layer 94 comprises silicon oxide, silicon nitride, or multilayers thereof. In other embodiments, the gate dielectric layer 94 includes a high-k dielectric material, and in these embodiments, the gate dielectric layers 94 may have a k value (e.g., dielectric constant) greater than about 7.0, and may include a metal oxide or a silicate of Hf, Al, Zr, La, Mg, Ba, Ti, Pb, and combinations thereof. The formation methods of gate dielectric layer 94 may include molecular beam deposition (MBD), atomic layer deposition (ALD), PECVD, and the like.

Next, the barrier layer 96 is formed conformally over the gate dielectric layer 94. The barrier layer 96 may comprise an electrically conductive material such as titanium nitride, although other materials, such as tantalum nitride, titanium, tantalum, or the like, may alternatively be utilized. The barrier layer 96 may be formed using a CVD process, such as PECVD. However, other alternative processes, such as sputtering, metal organic chemical vapor deposition (MOCVD), or ALD, may alternatively be used.

Next, the work function layer 98, such as a p-type work function layer or an n-type work function layer, may be formed in the recesses over the barrier layers 96 and before the gate electrode 86 is formed, in some embodiments. Exemplary p-type work function metals that may be included in the gate structures for p-type devices include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in the gate structures for n-type devices include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), and/or other suitable process.

Next, a seed layer (not shown) is formed conformally over the work function layer 98. The seed layer may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer comprises a titanium layer and a copper layer over the titanium layer.

Next, the gate electrode 86 is deposited over the seed layer, and fills the remaining portions of the recesses. The gate electrode 86 may be made of a metal-containing material such as Cu, Al, W, the like, combinations thereof, or multi-layers thereof, and may be formed by, e.g., electroplating, electroless plating, or other suitable method. After the formation of the gate electrode 86, a planarization process, such as a CMP, may be performed to remove the excess portions of the gate dielectric layer 94, the barrier layer 96, the work function layer 98, the seed layer, and the gate electrode 86, which excess portions are over the top surface of the first ILD 90. The resulting remaining portions of the gate dielectric layer 94, the barrier layer 96, the work function layer 98, the seed layer, and the gate electrode 86 thus form the replacement gate structure 97 (also referred to as the metal gate structure) of the resulting FinFET device 100. As illustrated in FIG. 9, due to the planarization process, the metal gate structure 97, the gate spacers 87, the CESL 89, and the first ILD 90 have a coplanar upper surface.

Figure 10:
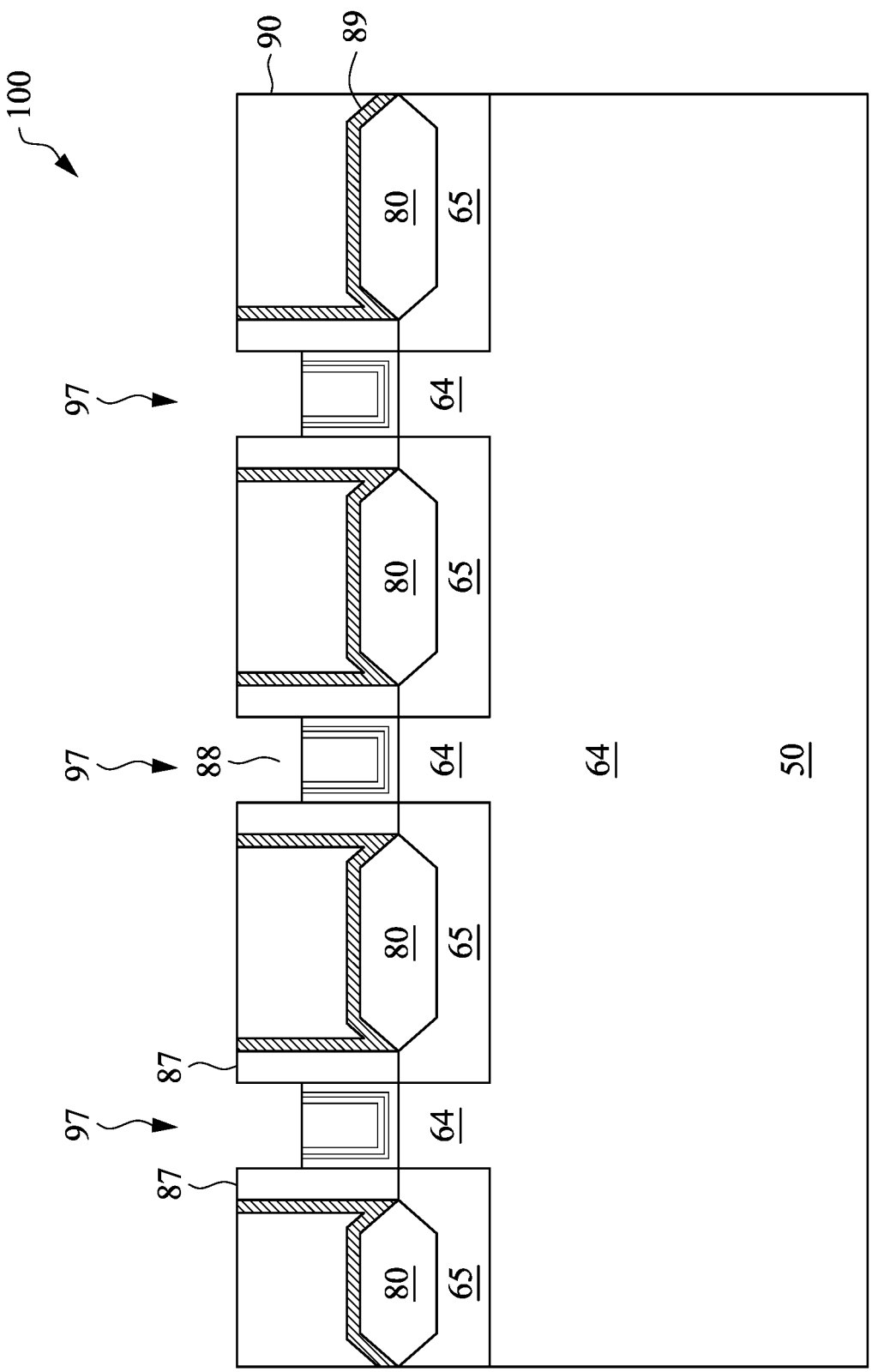

Next, in FIG. 10, a metal gate etch-back process is performed to remove upper portions of the metal gate structures 97, such that the metal gate structures 97 recess below the upper surface of the first ILD 90. Recesses 88 are formed between the gate spacers 87 after the metal gate etch-back process. A suitable etching process, such as dry etch, wet etch, or combinations thereof, may be performed as the metal gate etch-back process. An etchant for the etching process may be a halide (e.g., $CCl_4$), an oxidant (e.g., $O_2$), an acid (e.g., HF), a base (e.g., $NH_3$), an inert gas (e.g., Ar), combinations thereof, or the like, as an example.

Figure 11:
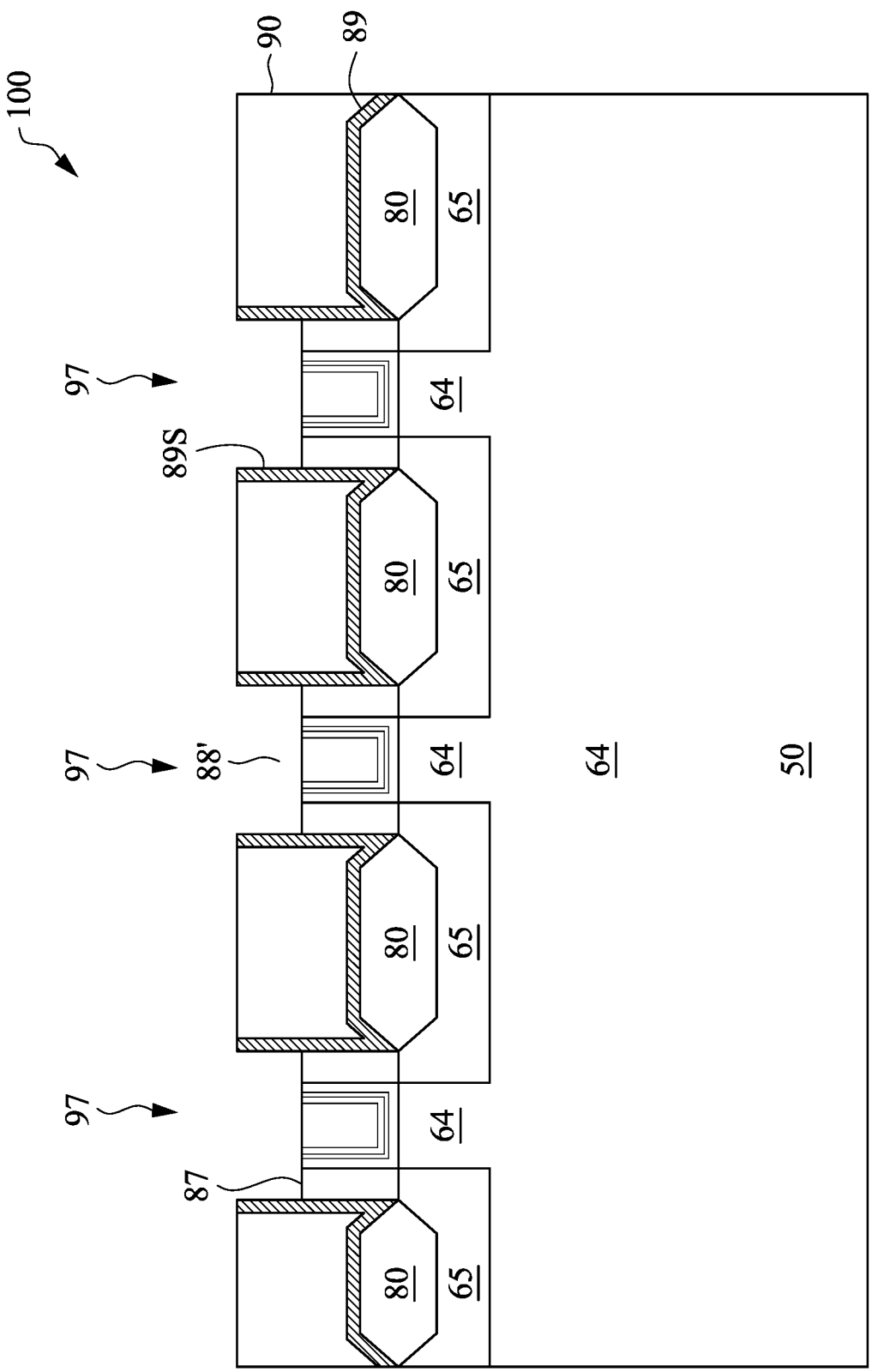

Next, in FIG. 11, the gate spacers 87 are recessed below the upper surface of the first ILD 90. In some embodiments, an anisotropic etching process, such as a dry etch process, is performed to remove upper portions of the gate spacer 87. In some embodiments, the anisotropic etching process is performed using an etchant that is selective to (e.g., having a higher etching rate for) the material of the gate spacers 87, such that the gate spacers 87 are recessed (e.g., upper portions removed) without substantially attacking the first ILD 90, the CESL 89, and the metal gate structures 97. After the upper portions of the gate spacers 87 are removed, the recesses 88 in FIG. 10 are expanded to form recesses 88', and upper sidewalls 89S of the CESL 89 are exposed. In the example of FIG. 11, after the gate spacers 87 are recessed, the upper surface of the gate spacers 87 are level with the upper surfaces of the metal gate structures 97, although in other embodiments, the upper surfaces of the gate spacers 87 may be slightly higher or lower than the upper surfaces of the metal gate structures 97.

Figure 12:
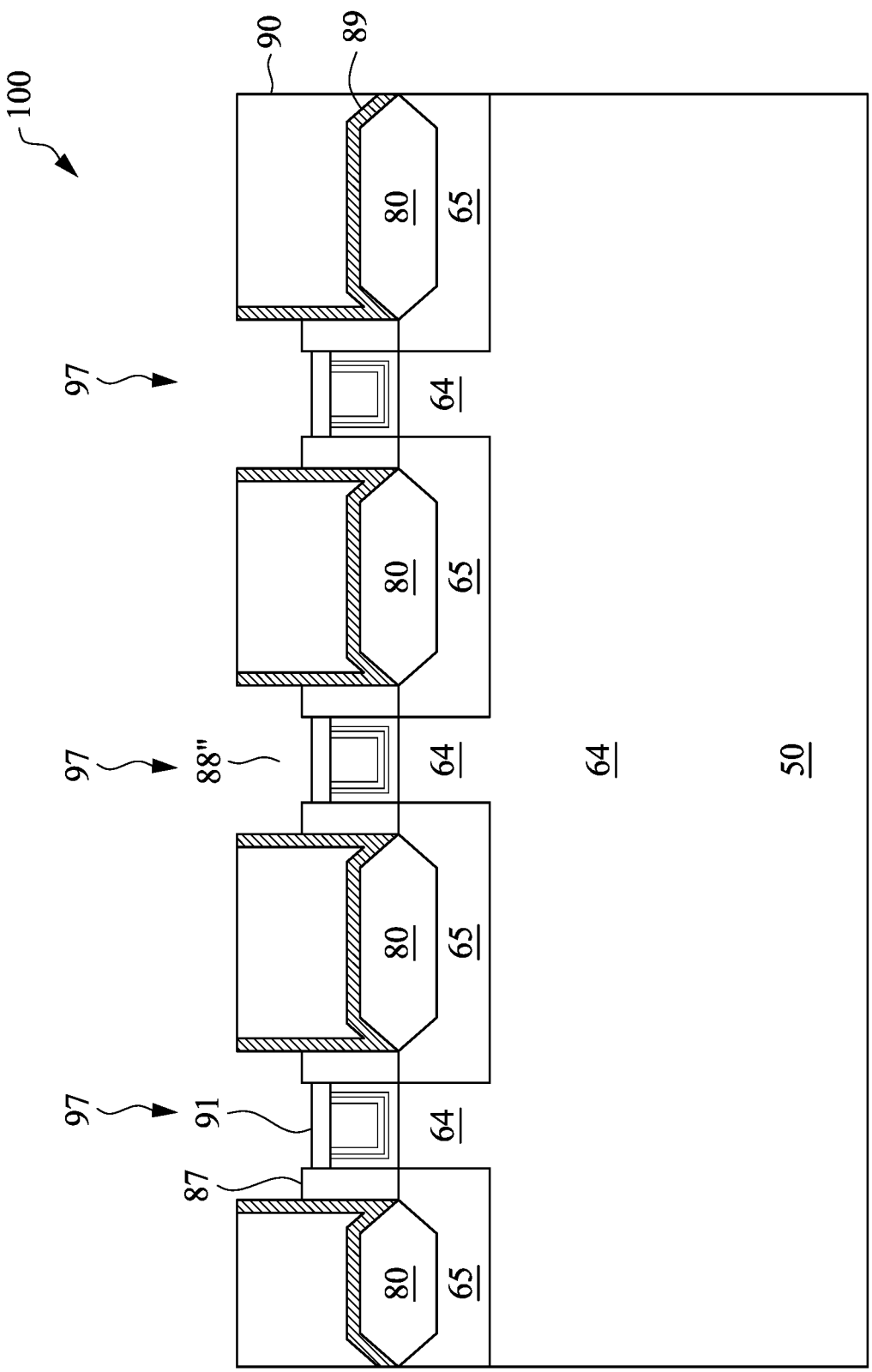

Next, in FIG. 12, the metal gate structures 97 are etched back again, such that the upper surfaces of the metal gate structures 97 recess below the upper surfaces of the gate spacers 87. The etch back of the metal gate structures 97 in FIG. 12 may be performed using the same or similar metal gate etch-back process described above with reference to FIG. 10, thus details are not repeated.

Next, a capping layer 91 is formed on the upper surface of the metal gate structures 97 to protect the metal gates structure 97, e.g., from oxidization and/or subsequent etching processes. The capping layer 91 is formed of a conductive material (e.g., metal), and is formed selectively on the upper surface of the metal gate structures 97, in the illustrated example. The capping layer 91 may be formed of, e.g., tungsten, although other suitable conductive material may also be used. A suitable formation method, such as CVD, PVD, ALD, or the like, may be used to form the capping layer 91. Note that in the discussion herein, unless otherwise specified, a conductive material refers to an electrically conductive material, and a conductive feature (e.g., a conductive line) refers to an electrically conductive feature. In the example of FIG. 12, the upper surface of the capping layer 91 is lower (e.g., closer to the substrate 50) than the upper surface of the gate spacers 87, and therefore, the recesses 88' in FIG. 11 are expanded and are denoted as recesses 88" in FIG. 12.

Figure 13:
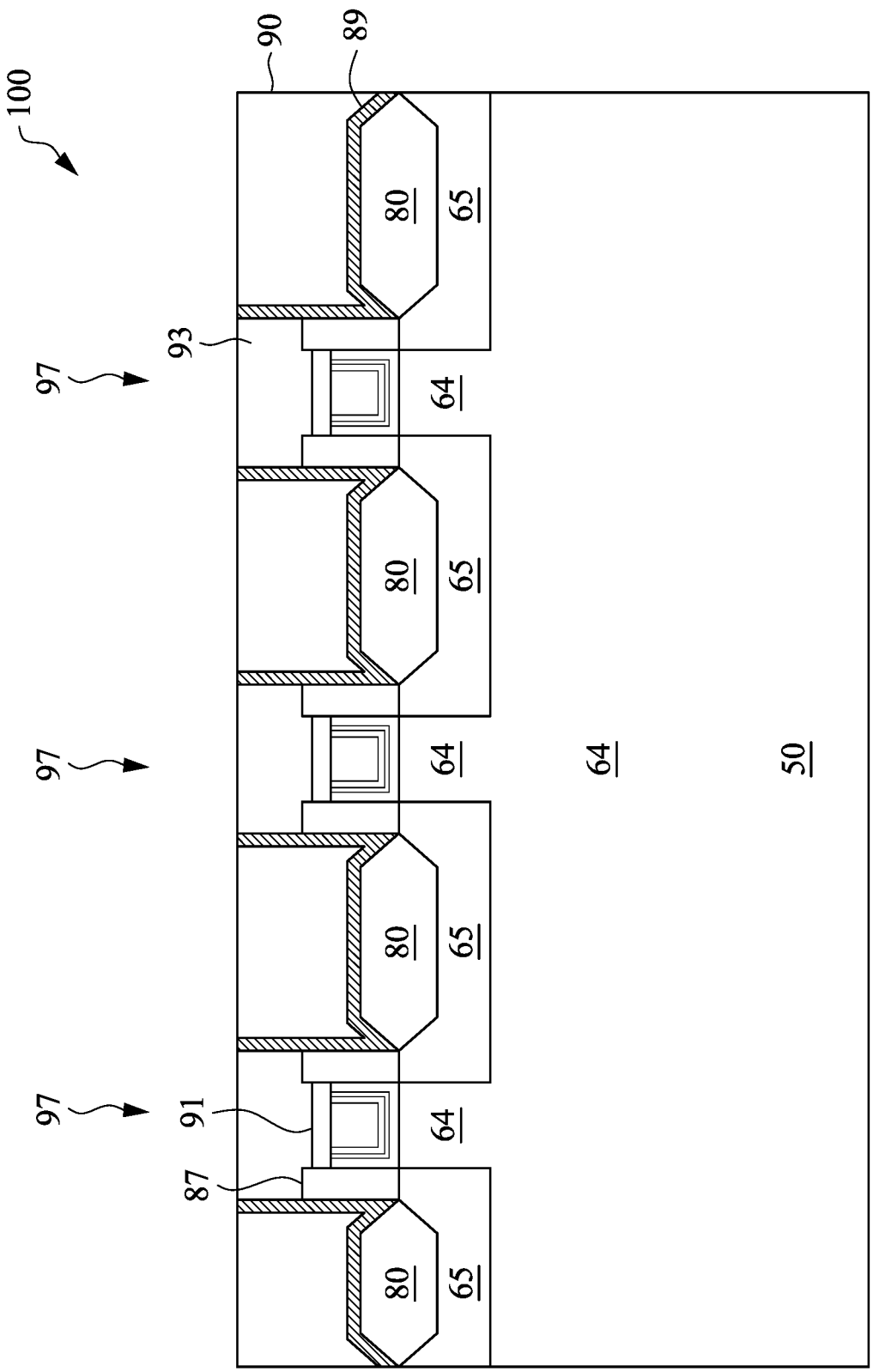

Next, in FIG. 13, a first material 93 is formed in the recesses 88" to fill the recesses 88", and a planarization process, such as CMP, may be performed next to remove excess portions of the first material 93 from the upper surface of the first ILD 90. In an embodiment, the first material 93 is silicon (e.g., Si). In another embodiment, the first material 93 is a dielectric material such as silicon carbide (e.g., SiC). The first material 93 may be formed using any suitable formation method such as CVD, PECVD, or the like.

Figure 14:
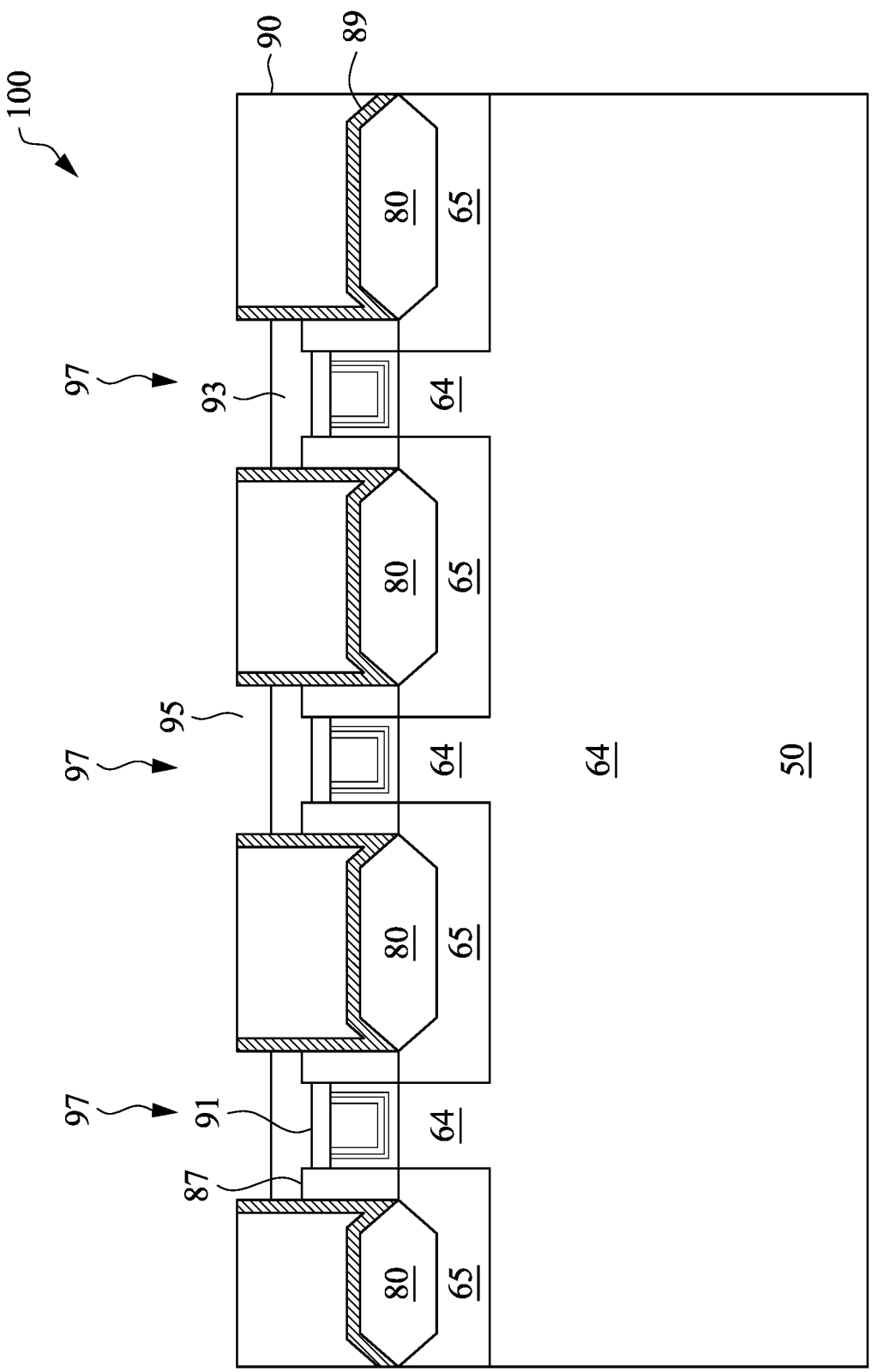

Next, in FIG. 14, the first material 93 is recessed below the upper surface of the first ILD 90. For example, an etching process such as dry etch or wet etch using an etchant selective to the first material 93 may be performed to remove upper portions of the first material 93, such that the upper surface of the first material 93 is recessed below the upper surface of the first ILD 90. After the recessing of the first material 93, upper sidewalls of the CESL 89 are exposed, and recesses 95 are formed between respective opposing sidewalls of the CESL 89.

Figure 15:
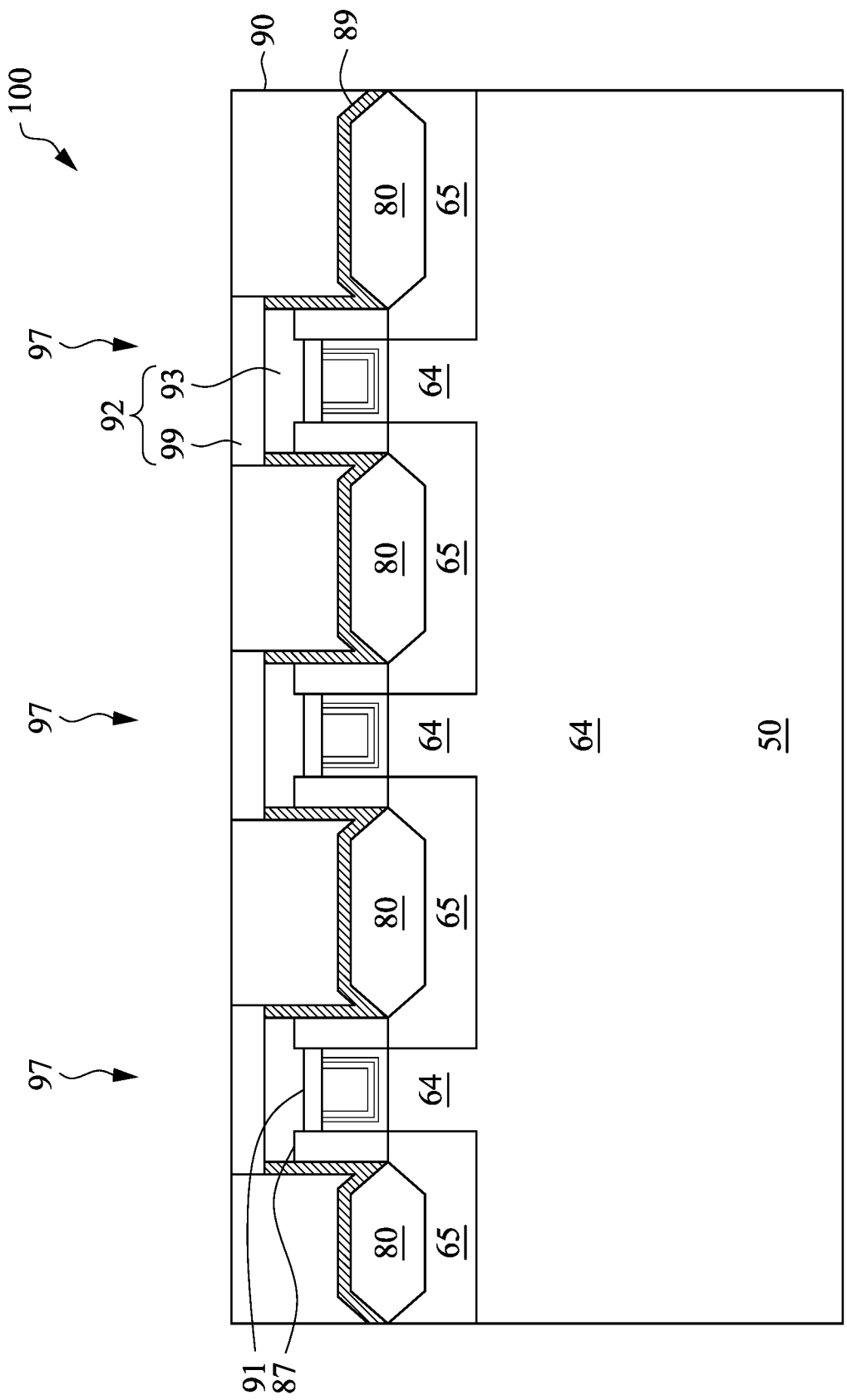

Next, in FIG. 15, the CESL 89 is recessed below the upper surface of the first ILD 90. For example, an etching process such as dry etch or wet etch using an etchant selective to the CESL 89 may be performed to remove upper portions of the CESL 89, such that the upper surface of the CESL 89 is recessed below the upper surface of the first ILD 90. In the example of FIG. 15, after the recessing of the CESL 89, the upper surface of the CESL 89 is level with the upper surface of the first material 93. In some embodiments, the upper surface of the CESL 89 is slightly higher or lower than the upper surface of the first material 93.

Next, a second material 99 is formed on the upper surface of the first material 93 and on the upper surface of the CESL 89 to fill the recesses 95, and a planarization process, such as CMP, may be performed next to remove excess portions of the second material 99 from the upper surface of the first ILD 90. In some embodiments, the second material 99 is different from the first material 93 to provide etching selectivity. The first material 93 and the second material 99 that are disposed over each metal gate structure 97 are collectively referred to as a bi-layered helmet 92, which protects the underlying structures, such as the metal gate structure 97, the gate spacers 87, and portions of the CESL 89 under the bi-layered helmet 92, from subsequent etching processes. Details are discussed hereinafter.

In some embodiments, the etch rate of the second material 99 for a subsequent etching process (see FIG. 17A) is smaller than the etch rate of the first material 93 for the subsequent etching process, such that the bi-layered helmet 92 could better resist (e.g., withstands) the subsequent etching process. In other words, the second material 99 may be chosen to be more resistant to the subsequent etching process (see FIG. 17A) than the first material 93. In some embodiments, the second material 99 is a dielectric material, such as a metal oxide (e.g., $ZrO_2$, $Al_2O_3$, or the like) or a metal nitride (e.g., AlN). The second material 99 may be formed using any suitable formation method such as CVD, PECVD, or the like.

Figure 16:
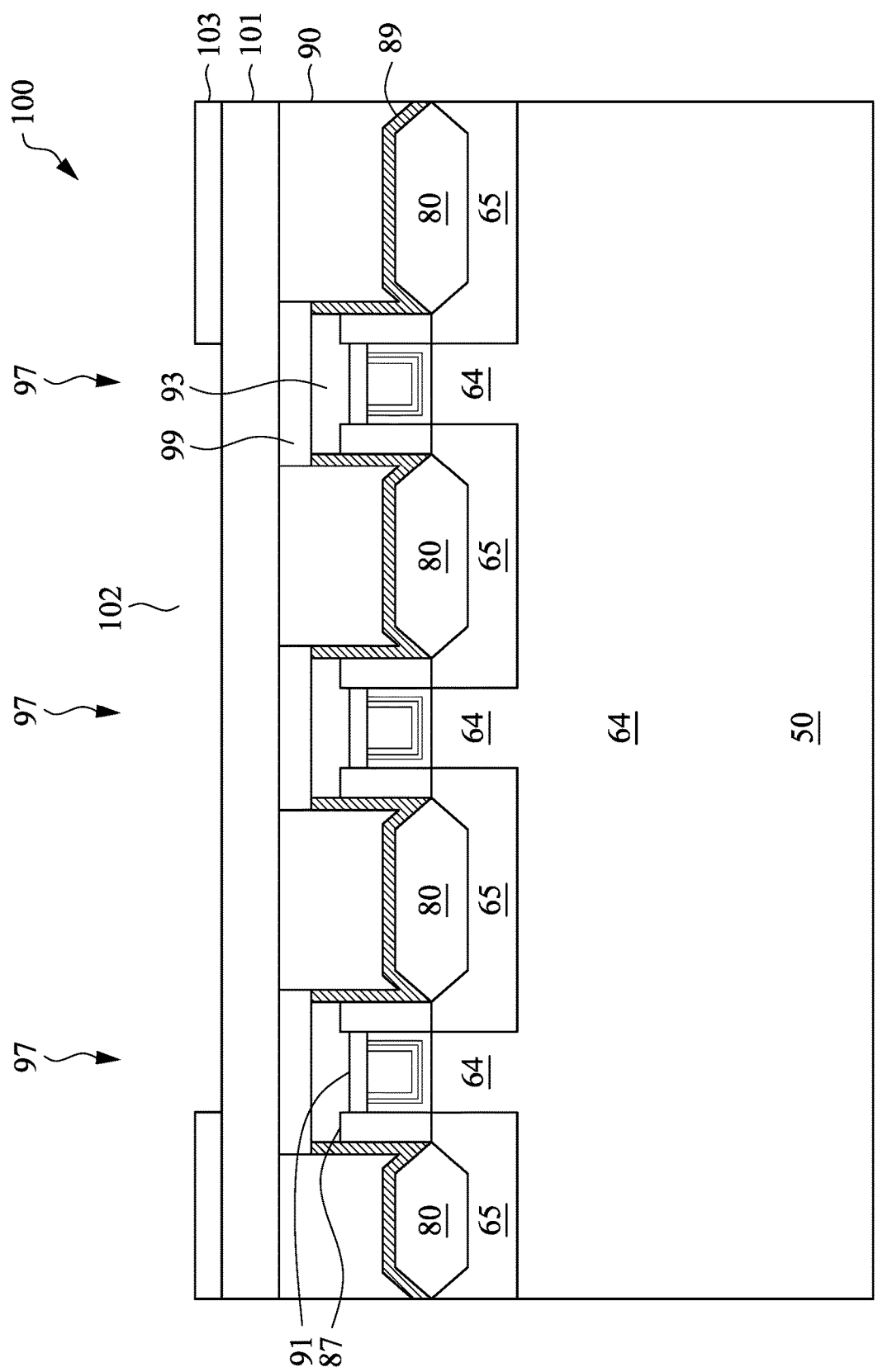

Next, in FIG. 16, a dielectric layer 101 is formed over the first ILD 90, and a patterned mask layer 103, such as a patterned photoresist, is formed over the dielectric layer 101. The dielectric layer 101 may comprise a same or similar material as the first ILD 90 and may be formed of a same or similar formation method as the first ILD 90, thus details are not repeated. In the example of FIG. 16, an opening 102 in the patterned mask layer 103 is over (e.g., directly over) some of the source/drain regions 80 and (at least portions of) some of the bi-layered helmets 92, such that in subsequent processing, openings 104 (see FIG. 17A) are formed in the first ILD 90, and self-aligned source/drain contacts 109 (see FIG. 21A) are formed in the openings 104 over the source/drain regions 80. The number and the locations of the openings 102 in FIG. 16 are merely non-limiting examples, one skilled in the art will readily appreciate that any numbers of the openings 102 may be formed, and the locations of the openings 102 may be at any suitable locations.

Figure 17A:
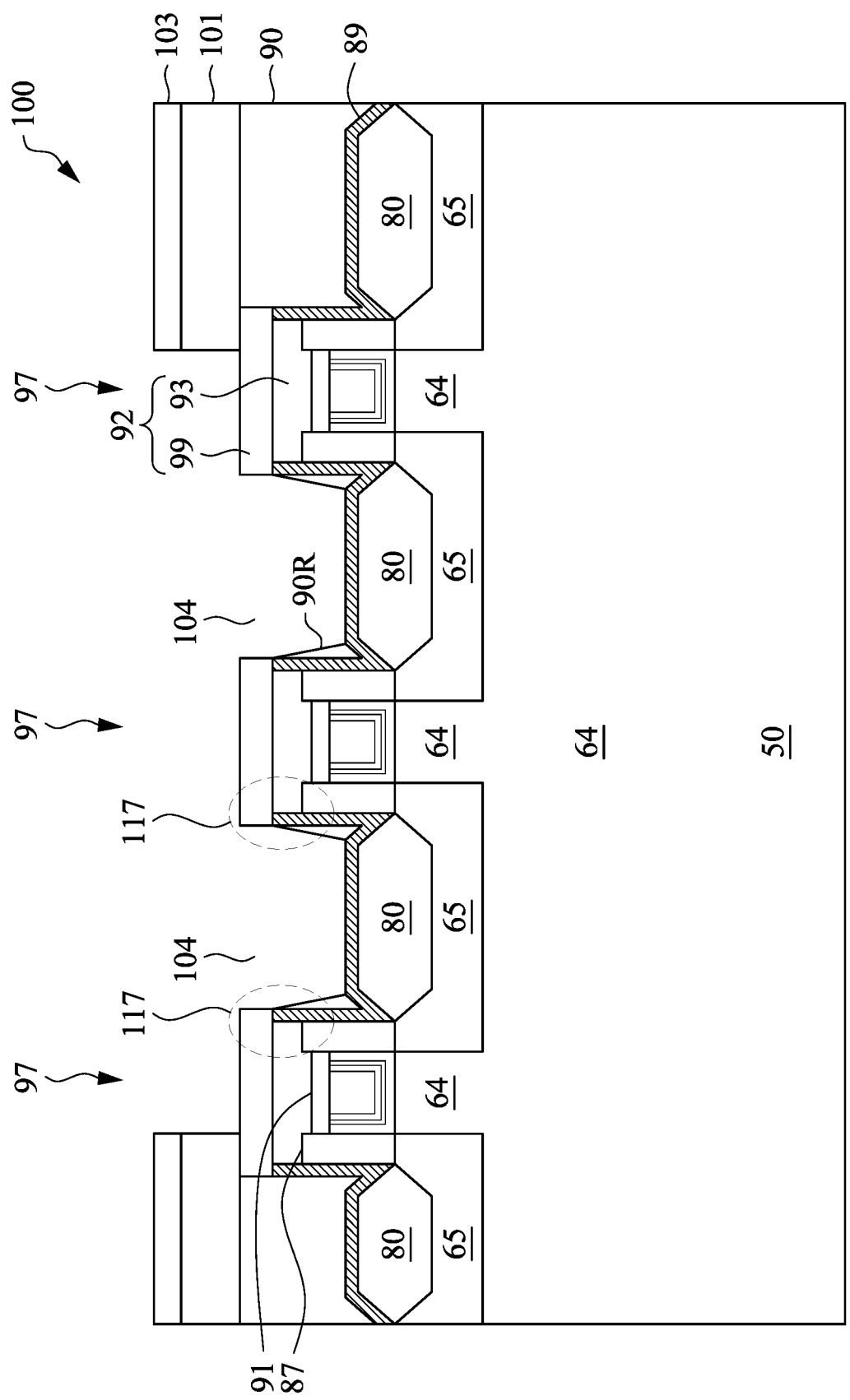

Next, in FIG. 17A, an etching process is performed to remove portions of the first ILD 90 and portions of the dielectric layer 101 that underlie the opening 102 of the patterned mask layer 103. The etching process may be an anisotropic etching process, such as a reactive ion etch (RIE), an atomic layer etch (ALE), or the like. The etching process may use an etchant that is selective to (e.g., having a higher etch rate for) the material(s) of the first ILD 90 and the dielectric layer 101. In an example embodiment, the first ILD 90 and the dielectric layer 101 are formed of silicon oxide, the gate spacers 87 and the CESL 89 are formed of silicon nitride, the first material 93 is formed of silicon, the second material 99 is formed of zirconium dioxide (e.g. $ZrO_2$), and the etching process uses an etching gas (may also be referred to as a process gas) comprising fluorocarbon (e.g., $C_xF_y$, where x is between 2 and 5, and y is between 5 and 8, such as $C_2F_6$ or $C_4F_8$). For example, the etching gas may be a mixture of fluorocarbon (e.g., $C_xF_y$), oxygen (e.g., $O_2$), and a carrier gas. As another example, the etching gas may be a mixture of fluorocarbon (e.g., $C_xF_y$), carbon monoxide (e.g., CO), and a carrier gas. As yet another example, the etching gas may be a mixture of fluorocarbon (e.g., $C_xF_y$), carbon dioxide (e.g., $CO_2$), and a carrier gas. The carrier gas may be He, Ne, Ar, Kr, Xe, or the like. Note that the etching gas comprising fluorocarbon may be used for other choices of the materials for, e.g., the first material 93 and the second material 99, besides the materials listed in the above example. As illustrated in FIG. 17A, after the etching process, openings 104 are formed in the first ILD 90, such as between opposing sidewalls of the CESL 89 and over source/drain regions 80.

Figure 17B:
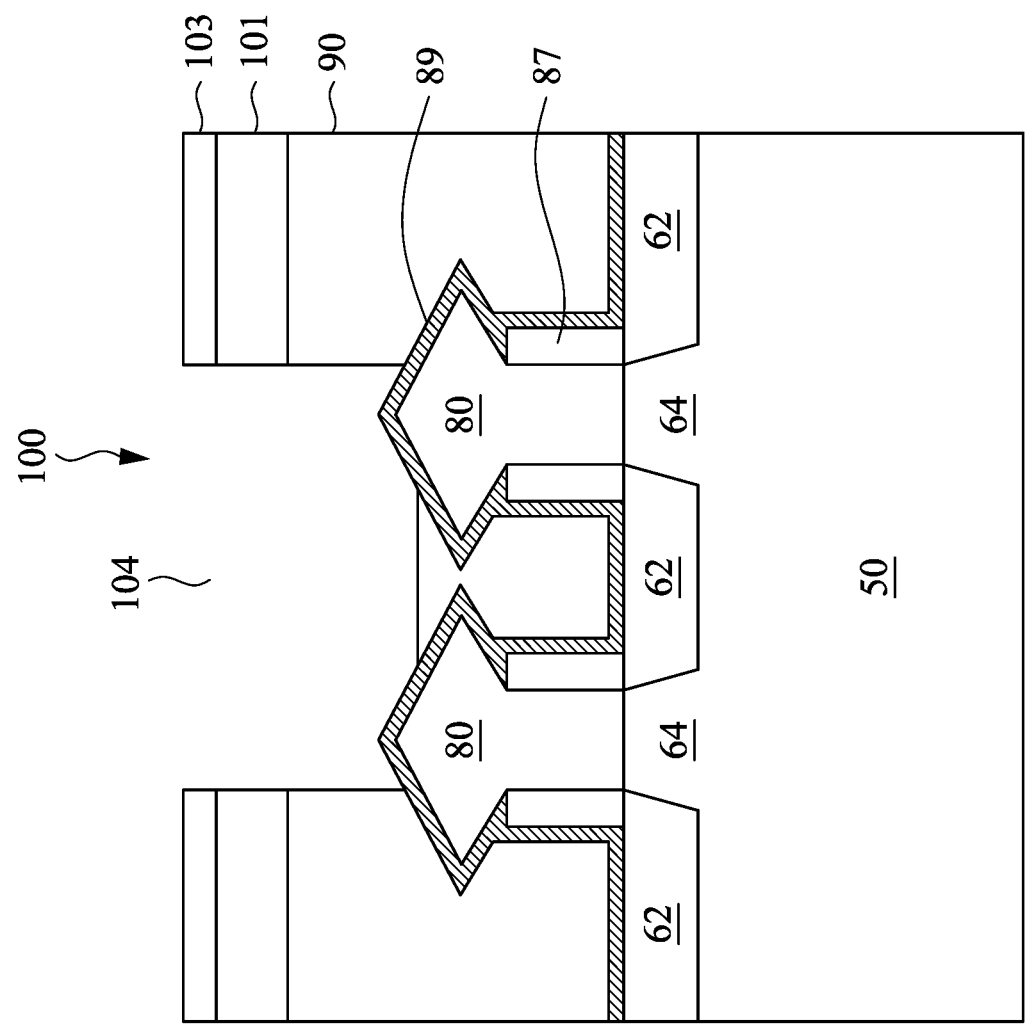

FIG. 17B illustrates the FinFET device 100 of FIG. 17A, but along cross-section C-C. Note that after the openings 104 are formed in FIGS. 17A and 17B, the CESL 89 still remains on the source/drain regions 80. In addition, as shown in FIG. 17A, there may be some residue portions 90R of the first ILD 90 at the bottom of the openings 104, e.g., at the bottom corners of the openings 104. The residue portions 90R of the first ILD 90 may be left at the bottoms of the openings 104 due to the difficulty for the plasma of the etching process (e.g., RIE or ALE) to reach the bottom of the openings 104.

As feature sizes continue to shrink in advanced semiconductor manufacturing, it may be advantageous to form self-aligned contacts (e.g., self-aligned source/drain contacts). This is because to form a non-self-aligned contact, a small via hole must be formed directly over the underlying conductive feature and then filled with a conductive material. However, during manufacturing, a slight misalignment between the photomask and the underlying wafer may cause the small via hole to miss the underlying conductive feature. The self-aligned contacts have larger openings (e.g., 104), thus relaxing the stringent requirement for photomask alignment and improve the process window. The current disclosure, with the bi-layered helmet 92, ensures that the openings 104 are formed properly without the "shoulder loss" problem discussed below.

To appreciate the advantage of the present disclosure, consider a reference design where the bi-layered helmet 92 is replaced with a single-layer helmet formed of a single layer of, e.g., silicon nitride. In the etching process to form the openings 104, materials (e.g., SiN) in the corner regions 117 of FIG. 17A near the shoulders (e.g., top corners) of the metal gate structures 97 may be etched away, if the single-layered helmet is used. This is referred to as the "shoulder loss" problem. Although the material of the single-layered helmet (e.g., silicon nitride) is different from the material (e.g., silicon oxide) of the first ILD 90, thus providing some etching selectivity, it has been observed during manufacturing that as the critical dimension (CD) of the semiconductor process decreases, the etching selectivity between materials in the corner regions 117 tends to decrease, and the materials in the corner regions 117 tend to be etched away faster than materials in flat regions (e.g., regions between the corner regions), thus causing the "shoulder loss" problem. If "shoulder loss" occurs, when the openings 104 are filled with a conductive material to form self-aligned source/drain contacts, the conductive material may fill the corner regions 117, thus causing electrical short between the source/drain regions 80 and the metal gate structures 97.

The bi-layered helmet 92 provides significantly improved etching selectivity to resist the etching process for forming the openings 104, thereby preventing or reducing the occurrence of "shoulder loss" problem. To illustrate the improved etching selectivity, consider the example above where the first ILD 90 and the dielectric layer 101 are formed of silicon oxide, the gate spacers 87 and the CESL 89 are formed of silicon nitride, the first material 93 is formed of silicon, the second material 99 is formed of zirconium dioxide (e.g. $ZrO_2$), and the etching process uses a process gas comprising fluorocarbon. The etching selectivity (e.g. the ratio of the etch rates) between the material of the first ILD 90 (e.g., silicon oxide) and the material (e.g., silicon nitride) of the gate spacers 87/CESL 89 is between about 3 and 6. The etching selectivity between the material of the first ILD 90 (e.g., silicon oxide) and the first material 93 (e.g., Si) is between about 6 and 9. The etching selectivity between the material of the first ILD 90 (e.g., silicon oxide) and the second material 99 (e.g., $ZrO_2$) is between about 9 and 15. The bi-layered helmet 92, with higher etching selectivity and the bi-layered structure, among other features, is able to withstand the etching process and provides protection for the underlying features, thus reducing or preventing the occurrence of "shoulder loss" problem.

Figure 18A:
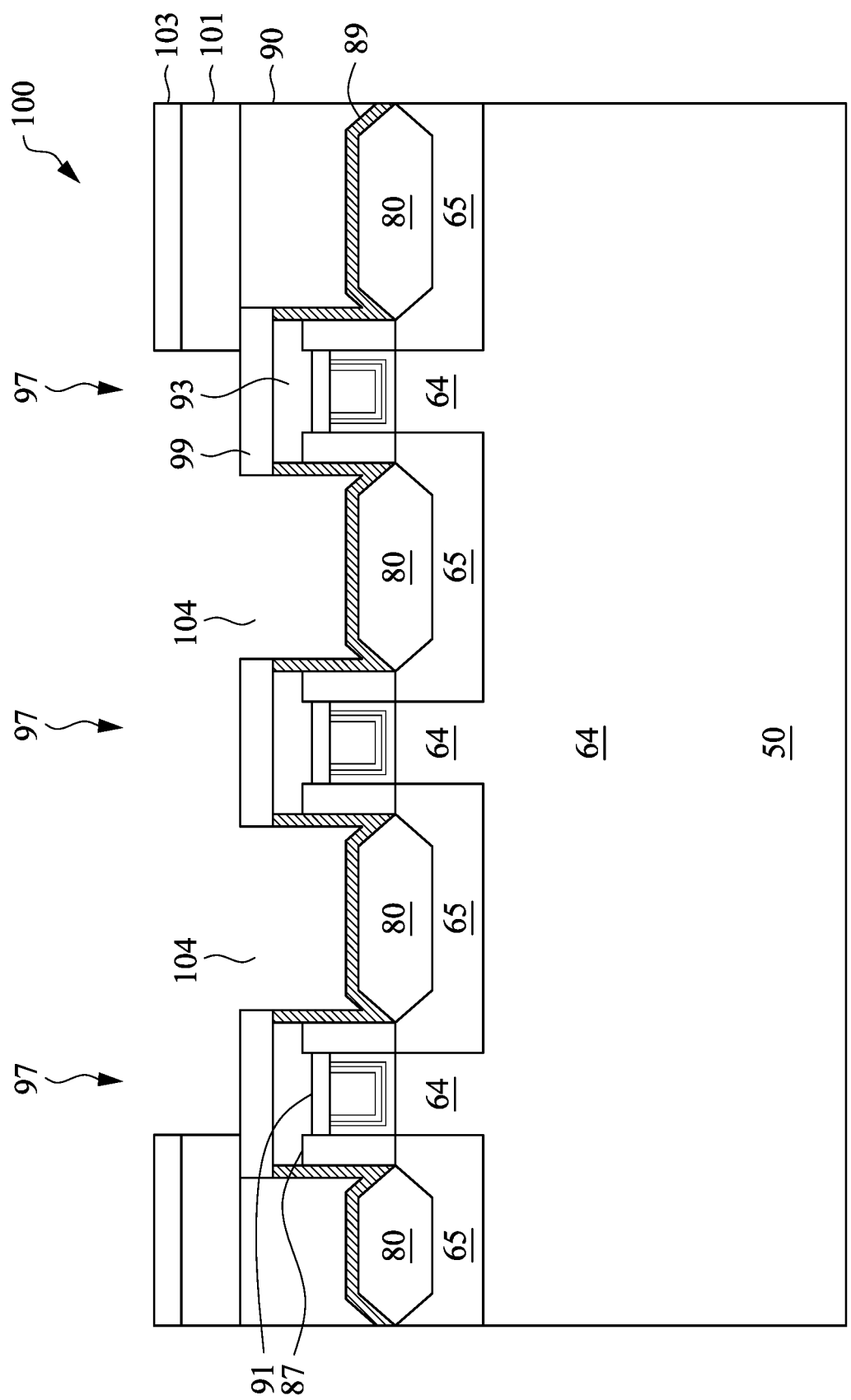
Figure 18B:
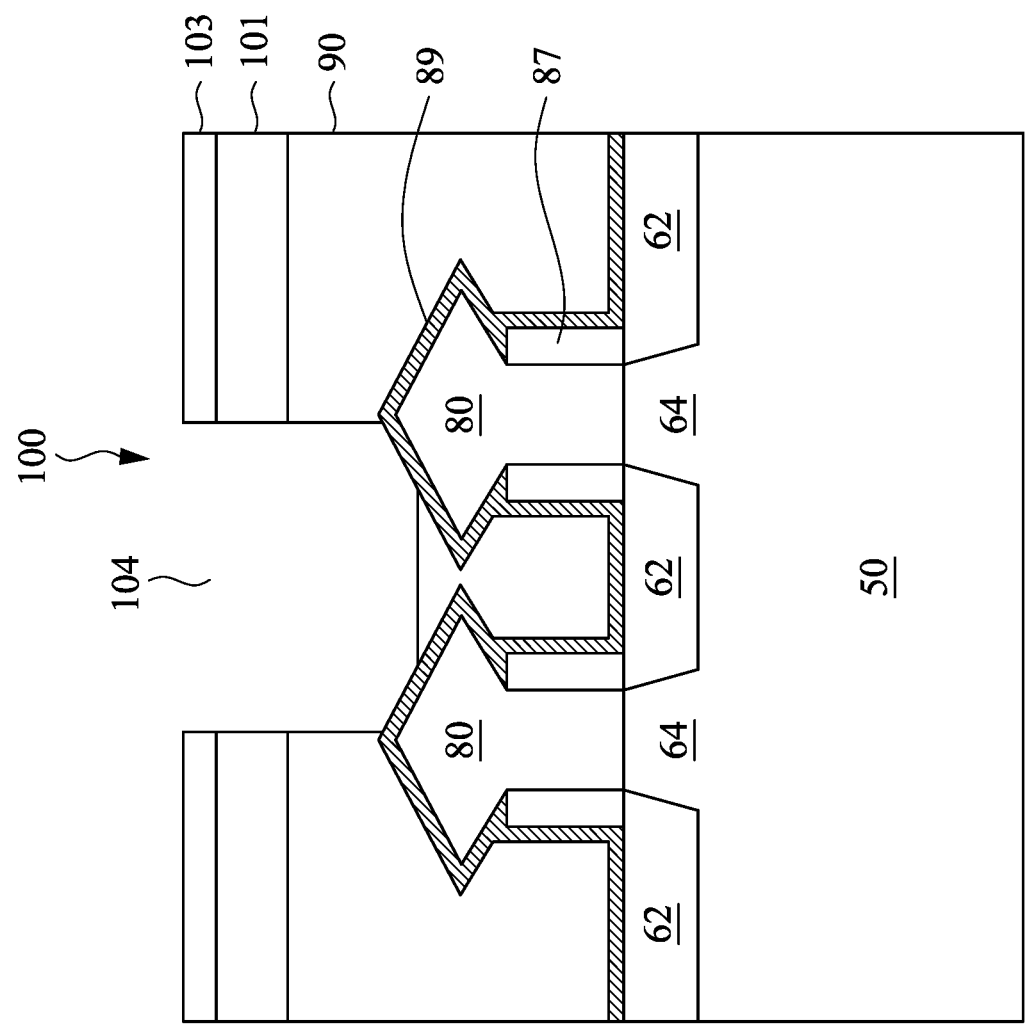

Next, as illustrated in FIGS. 18A and 18B, an etching process is performed to remove the residue portions 90R of the first ILD 90. The etching process may be an isotropic etching process and may use an etchant selective to the material of the first ILD 90. In some embodiments, an isotropic dry etch process is performed to remove the residue portions 90R using an etching gas comprising, e.g., HF, $NF_3$, combinations thereof, or the like. A carrier gas, such as Ar, $N_2$, combinations thereof, or the like, may be used to carry the etching gas into the process chamber of the etching process. A pressure of the dry etch process may be between about a few mTorr to a few Torr, such as between 2 mTorr and 5 Torr. The dry etch process may include a few etching cycles. After the dry etch process is finished, a heat processing may be performed to remove by-product(s) of the dry etch process. The etching process to remove the residue portions 90R of the first ILD 90 may also be referred to as a de-footing process. By removing the residue portions 90R, the de-footing process increases the volume of the openings 104, which in turn increases the volume of the self-aligned source/drain contact formed in the openings 104, and therefore, advantageously reduces the electrical resistance of the self-aligned source/drain contact.

In some embodiment, after the de-footing process, a wet cleaning process is performed to clean the openings 104. The wet cleaning process may be performed using a sulfuric peroxide mixture (SPM) or a mixture of de-ionized (DI) water and $O_3$. Next, an etching process is performed using, e.g., HCl, $H_2O_2$, $H_2O$, combinations thereof, or the like, to remove by-product(s) of the wet cleaning process.

Figure 19A:
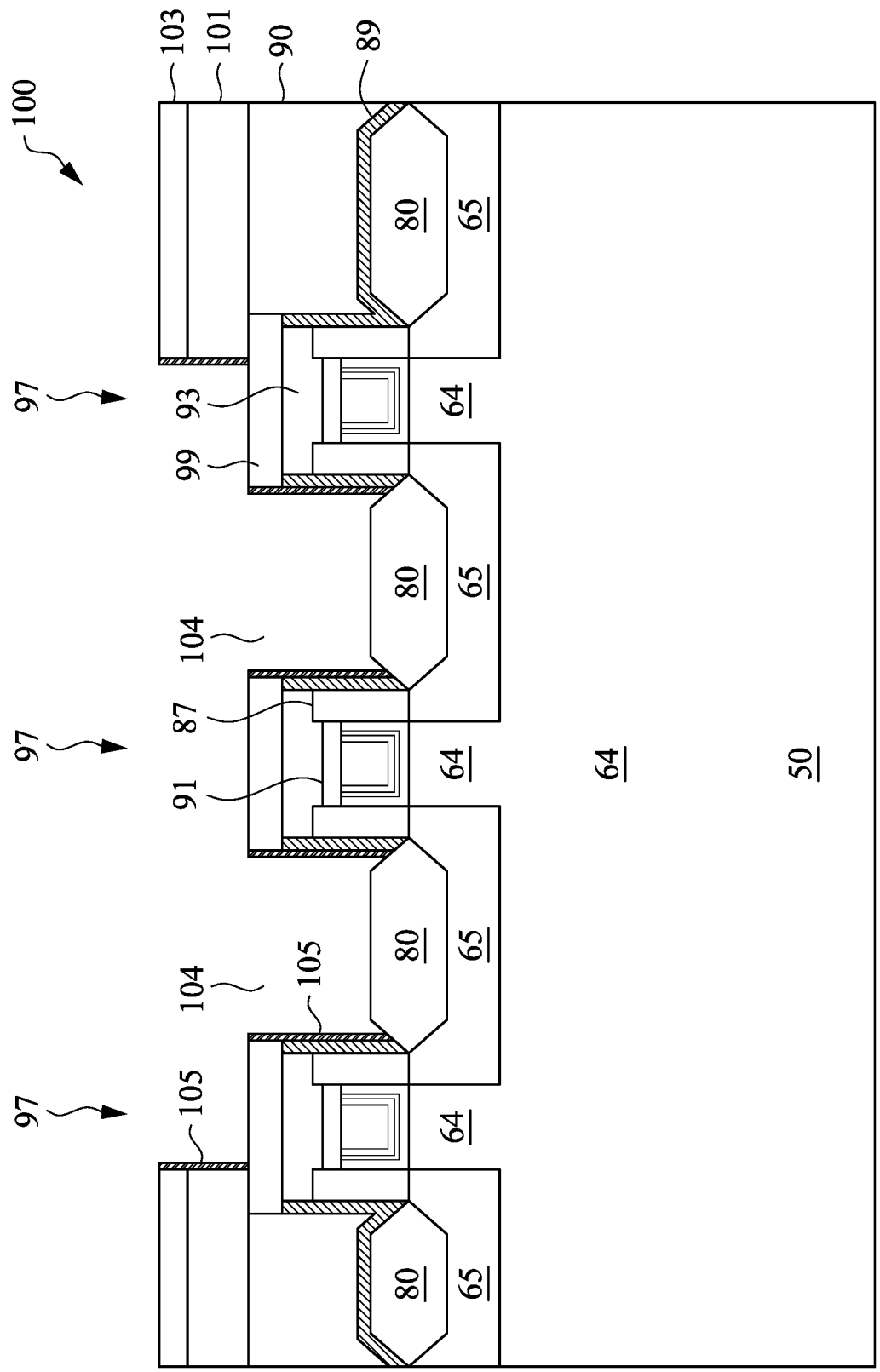
Figure 19B:
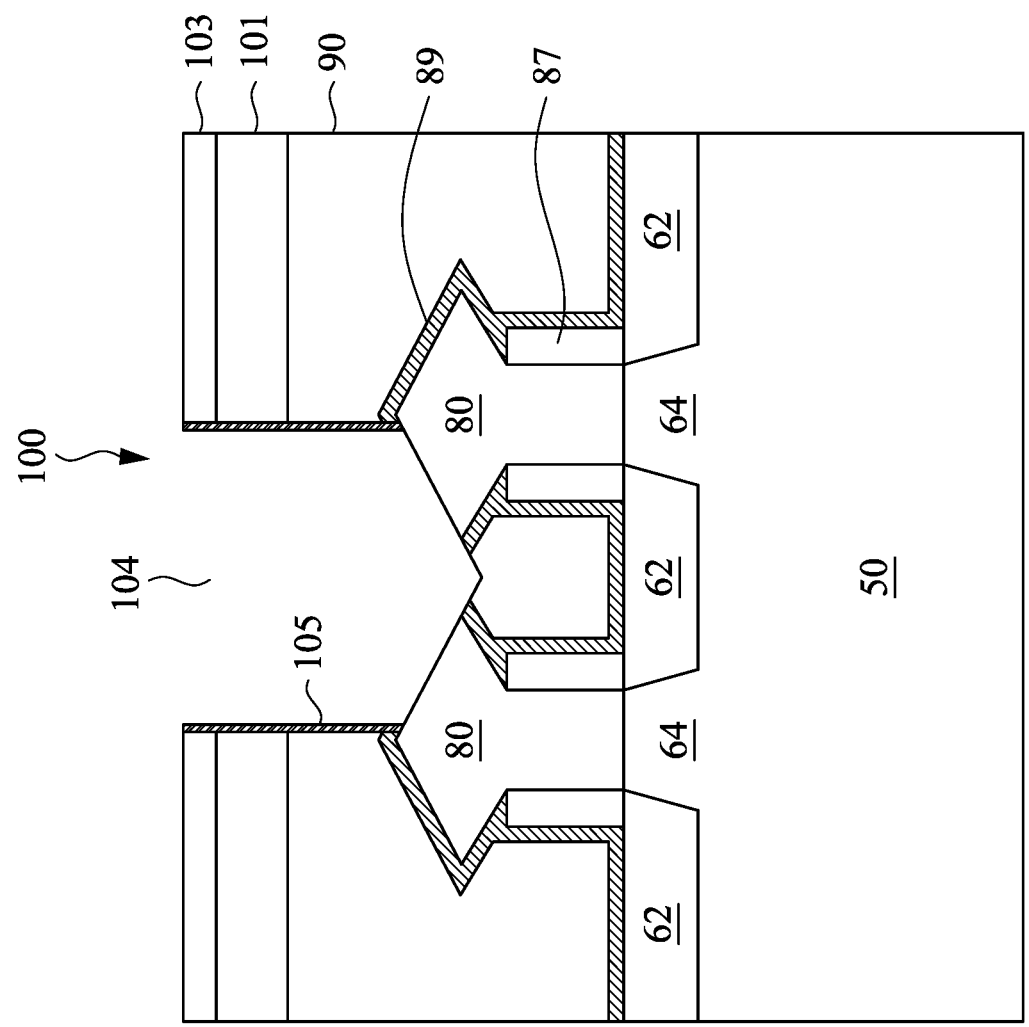

Next, in FIGS. 19A and 19B, a barrier layer 105 is formed conformally over the structure of FIGS. 18A and 18B. The barrier layer 105 may comprise titanium, titanium nitride, tantalum nitride, or the like, and may be formed using a suitable formation method such as ALD, CVD, or the like. As illustrated in FIG. 19A, the barrier layer 105 is formed to line sidewalls and bottoms of the openings 104. Next, an anisotropic etching process is performed to remove horizontal portions of the barrier layer 105, such as portions over the upper surface of the second material 99 and portions over the upper surface of the patterned mask layer 103. In some embodiments, the anisotropic etching process also removes the CESL 89 on the source/drain region 80. In other embodiments, an additional etching process is performed after the anisotropic etching process to remove the CESL 89 to expose the source/drain regions 80.

Figure 20A:
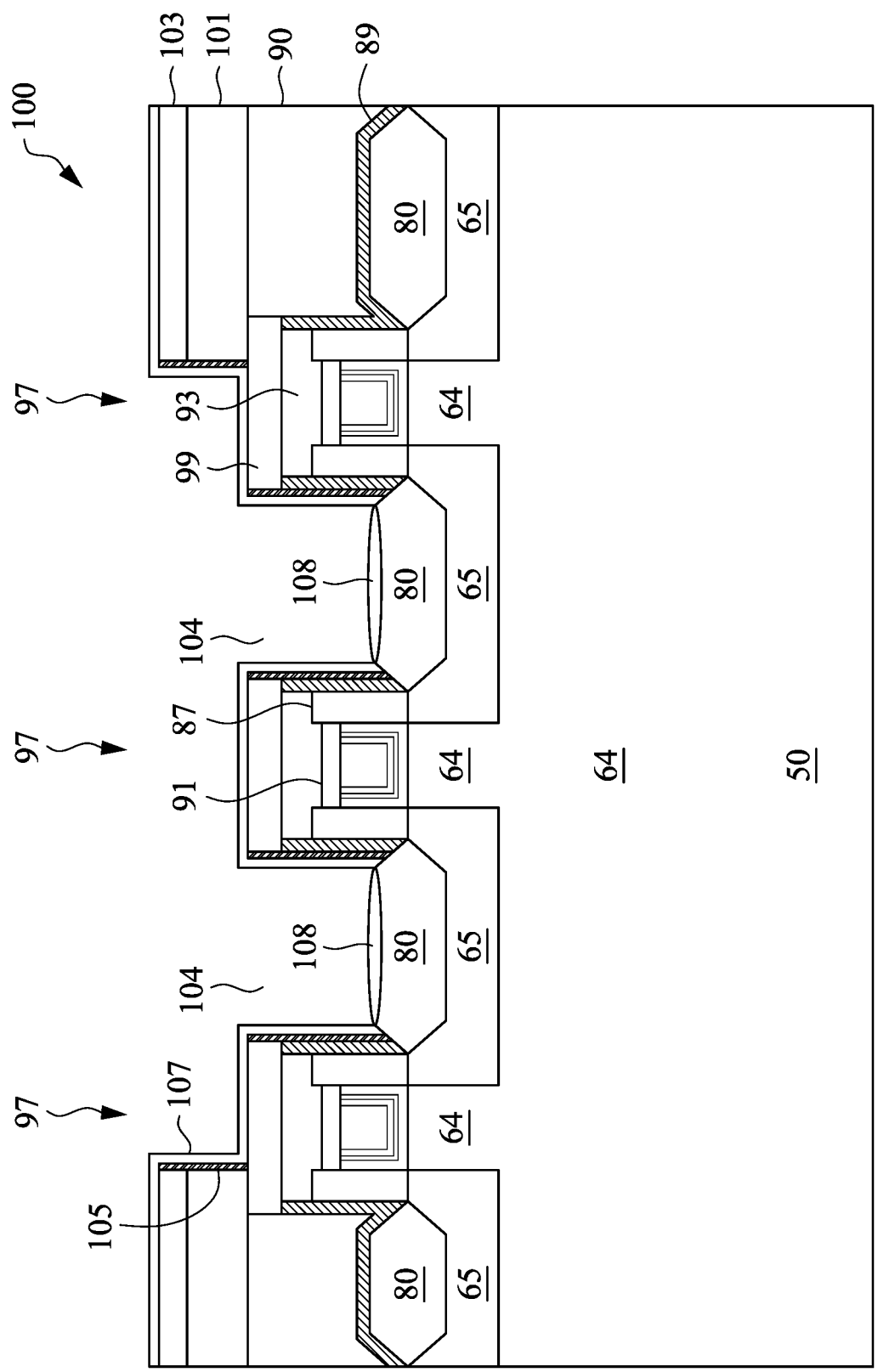
Figure 20B:
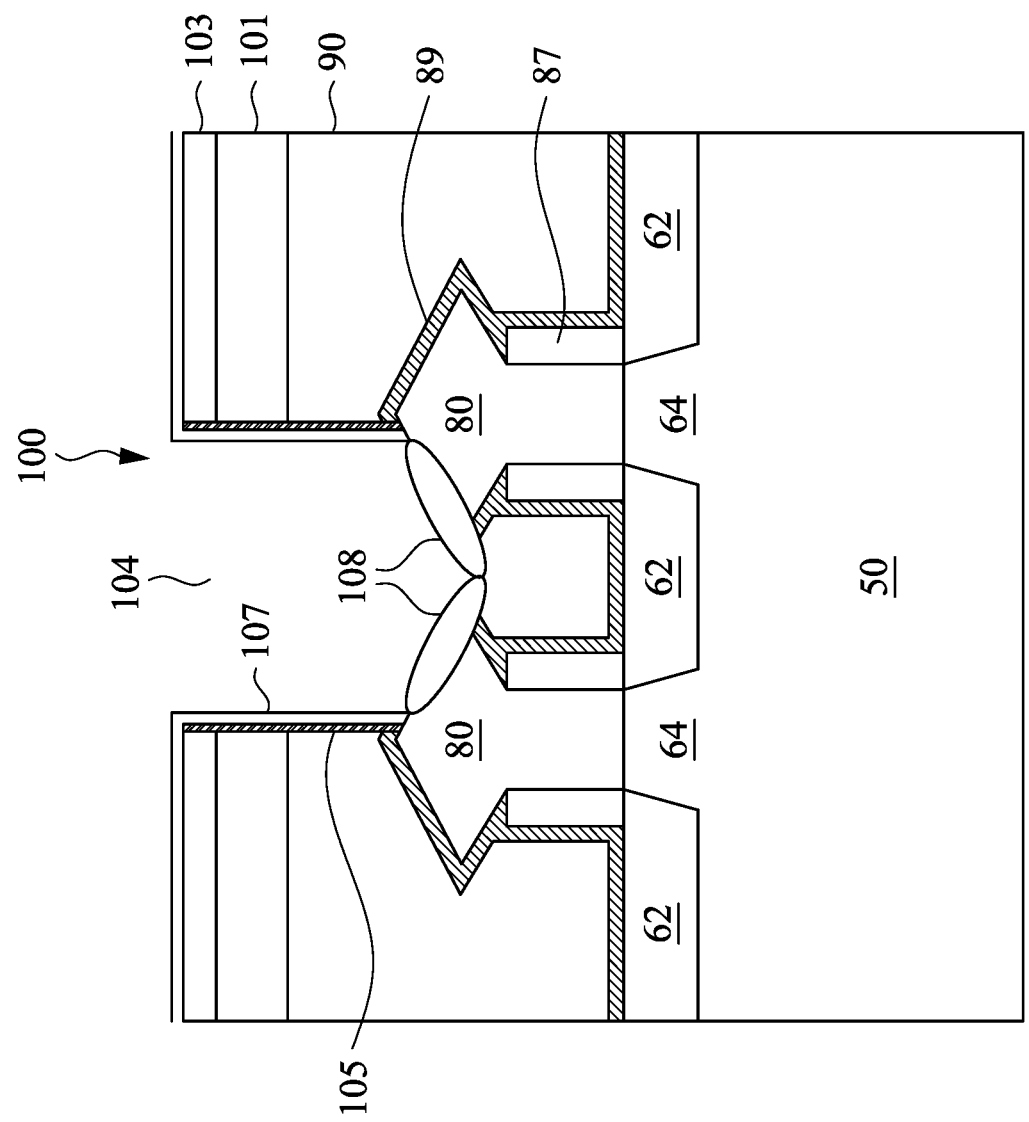

Next, in FIGS. 20A and 20B, silicide regions 108 are formed over the source/drain regions 80. A pre-cleaning process may be performed to clean the openings 104 before the silicide regions 108 are formed. The silicide regions 108 may be formed by first depositing a metal layer 107 capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys, over the source/drain regions 80, then performing a thermal anneal process to form the silicide regions 108. In some embodiments, the un-reacted portions of the deposited metal layer 107 are removed (e.g., by an etching process after the thermal anneal process), and therefore, the metal layer 107 is not illustrated in subsequent figures. Although regions 108 are referred to as silicide regions, the regions 108 may also be germanide regions, or silicon germanide regions (e.g., regions comprising silicide and germanide).

Figure 21A:
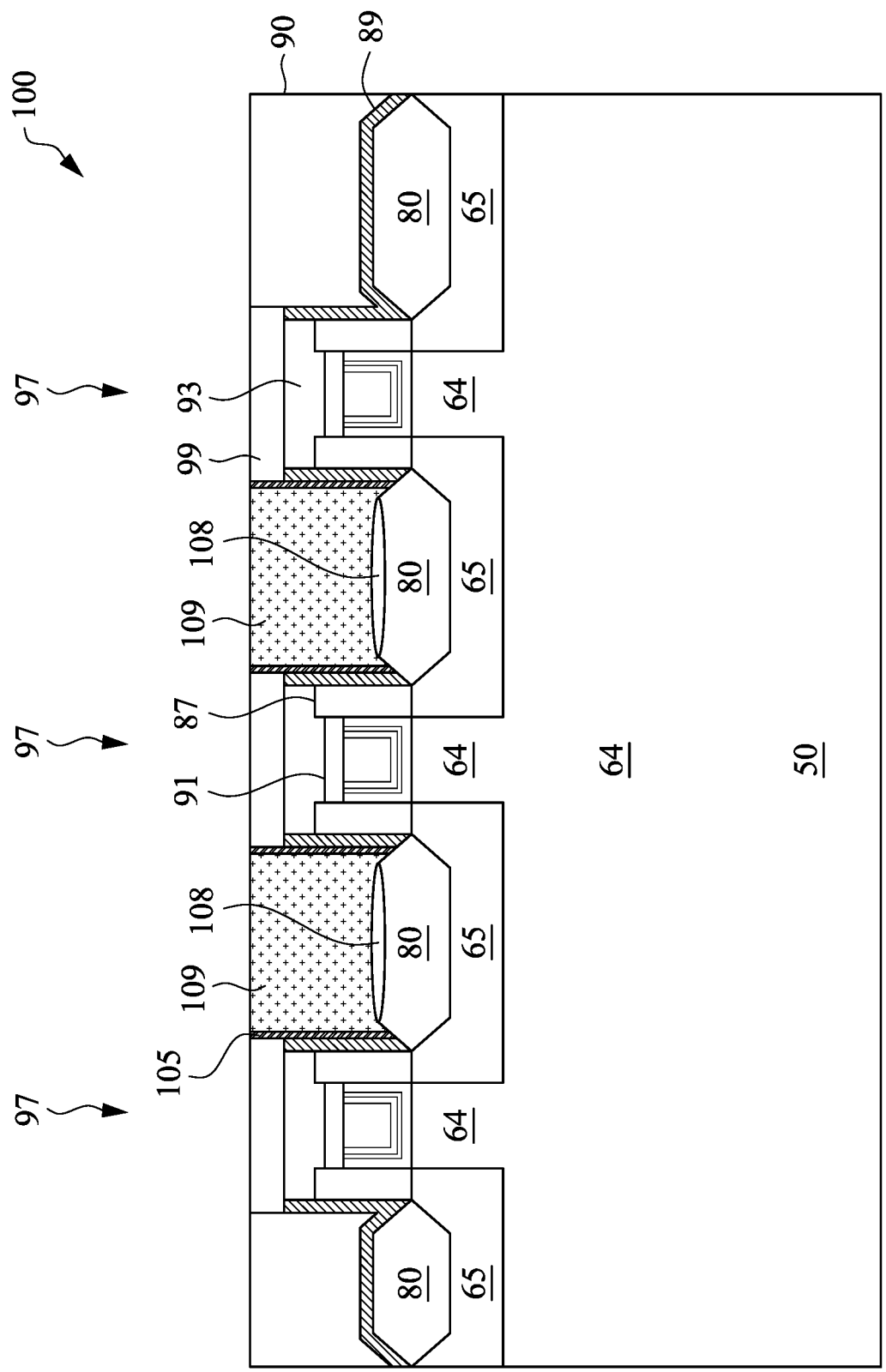
Figure 21B:
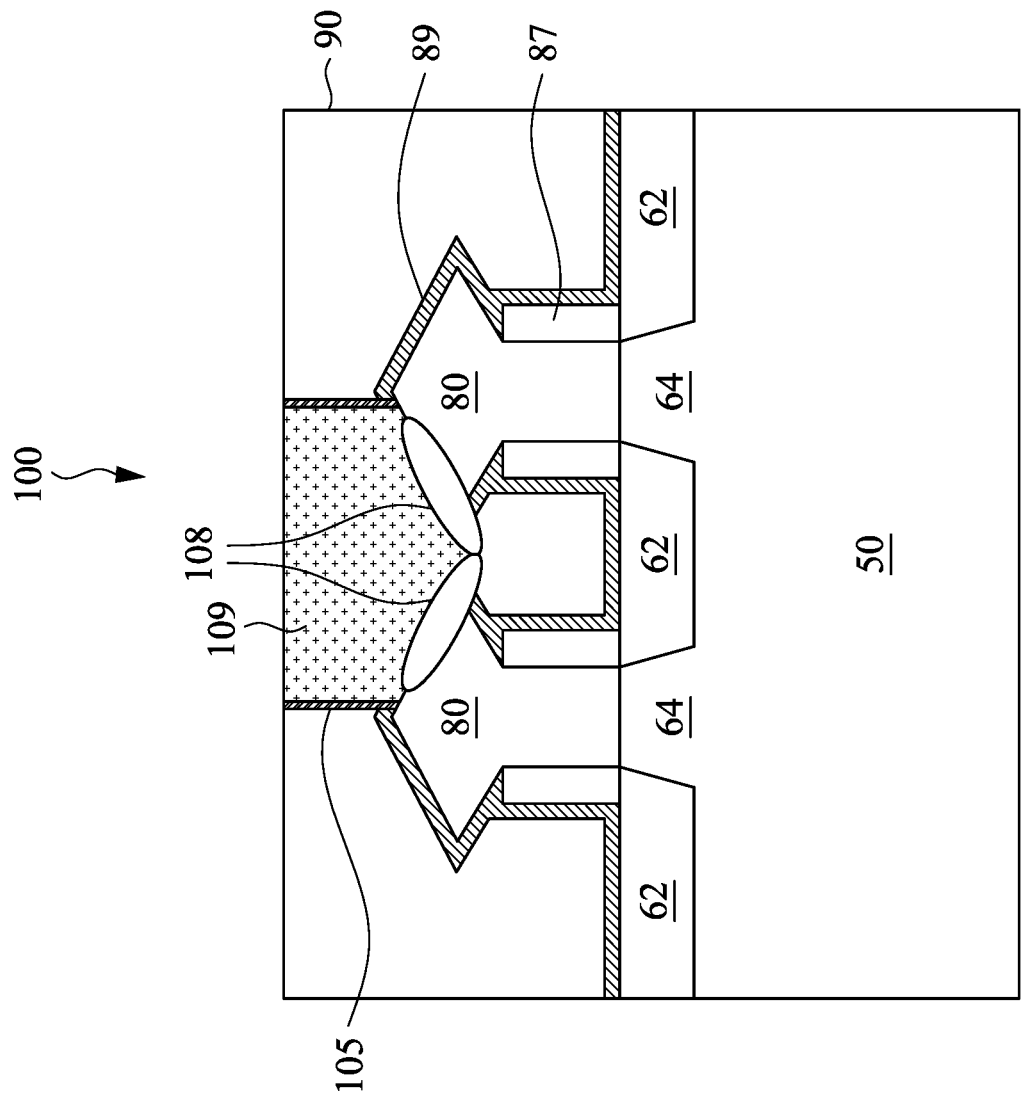
Figure 22:
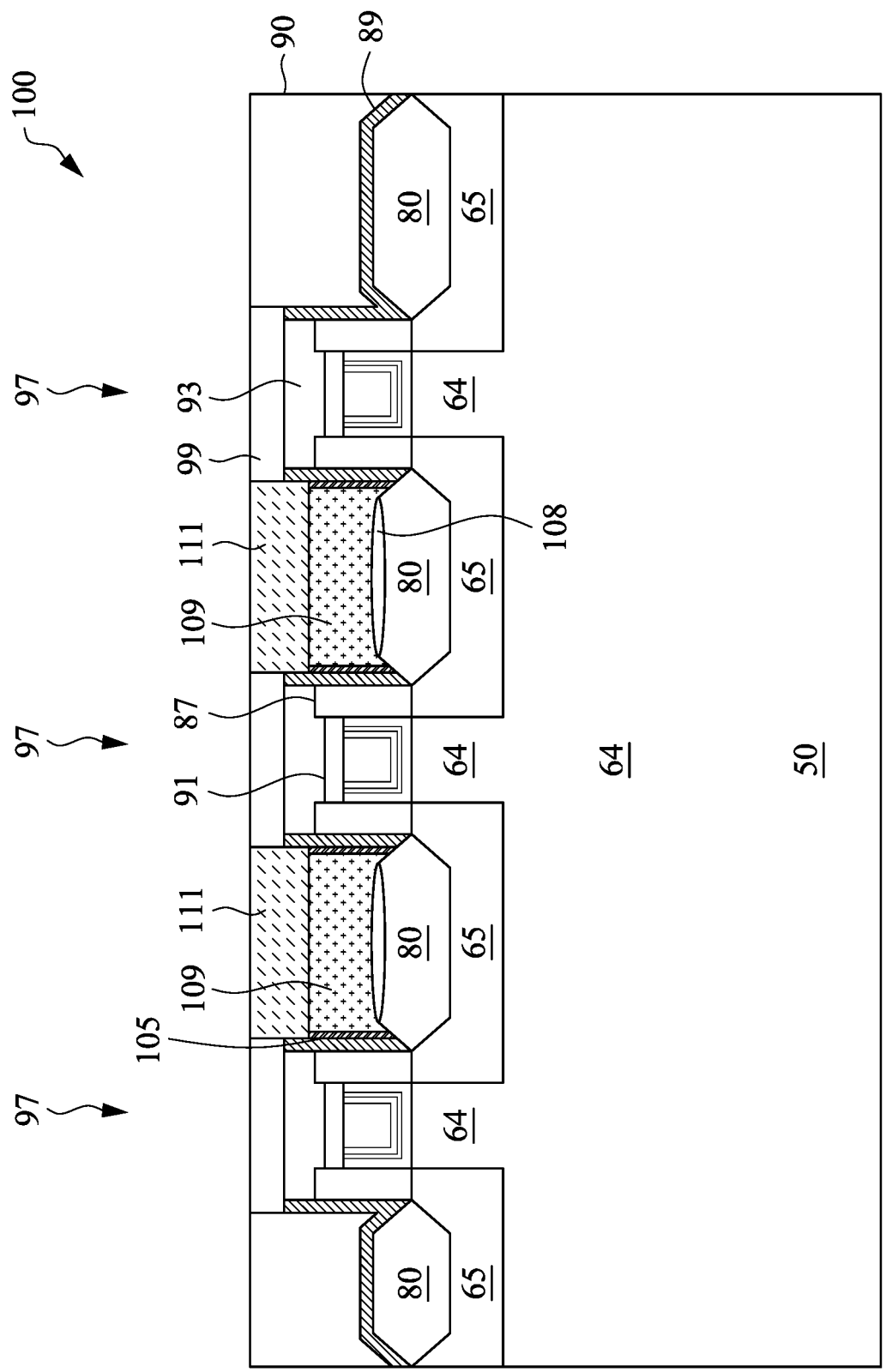

Next, in FIGS. 21A and 21B, a conductive material, such as tungsten, cobalt, copper, or the like, is formed to fill the openings 104. Next, a planarization process, such as CMP, is performed to remove excess portions of the conductive material from over the upper surface of the first ILD 90. The planarization process also removes the dielectric layer 101 and the patterned mask layer 103, in the illustrated embodiment. The remaining portions of the conductive material in the openings 104 form self-aligned source/drain contacts 109. For simplicity, the self-aligned source/drain contacts 109 may also be referred to as source/drain contacts 109.

Next, in FIG. 22, an etching process is performed to recess the source/drain contacts 109 and the barrier layer 105 below the upper surface of the first ILD 90. Next, a dielectric layer 111 is formed in the recesses that are formed by the recessing of the source/drain contacts 109 and the barrier layer 105. The dielectric layer 111 may comprise, e.g., silicon nitride, silicon oxide, or silicon oxycarbonitride (SiOCN), and may be formed by CVD, PVD, ALD, or the like. A planarization process, such as CMP, may be performed to remove excess portions of the dielectric layer 111 from the upper surface of the first ILD 90.

Figure 23A:
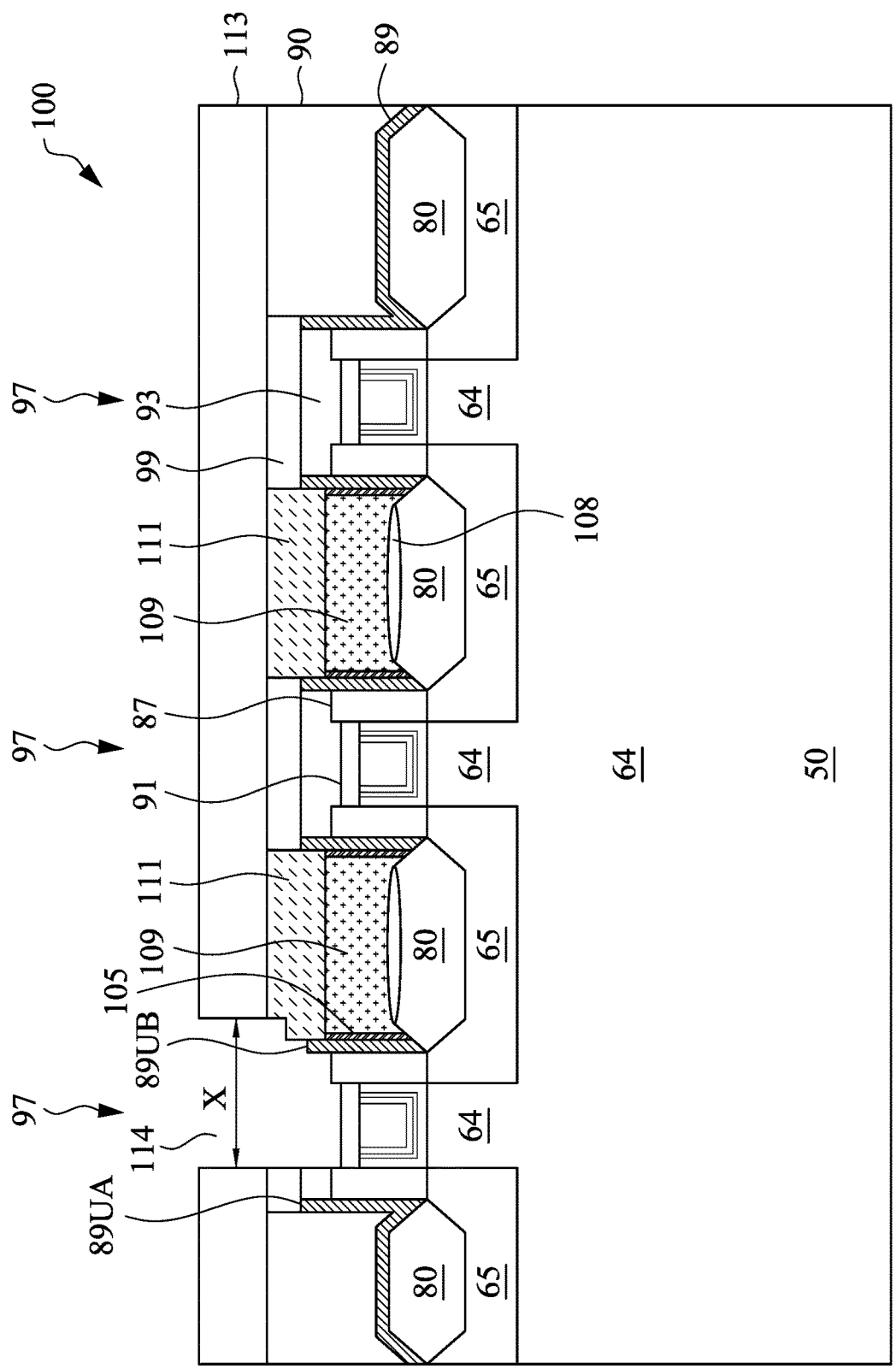
Figure 23B:
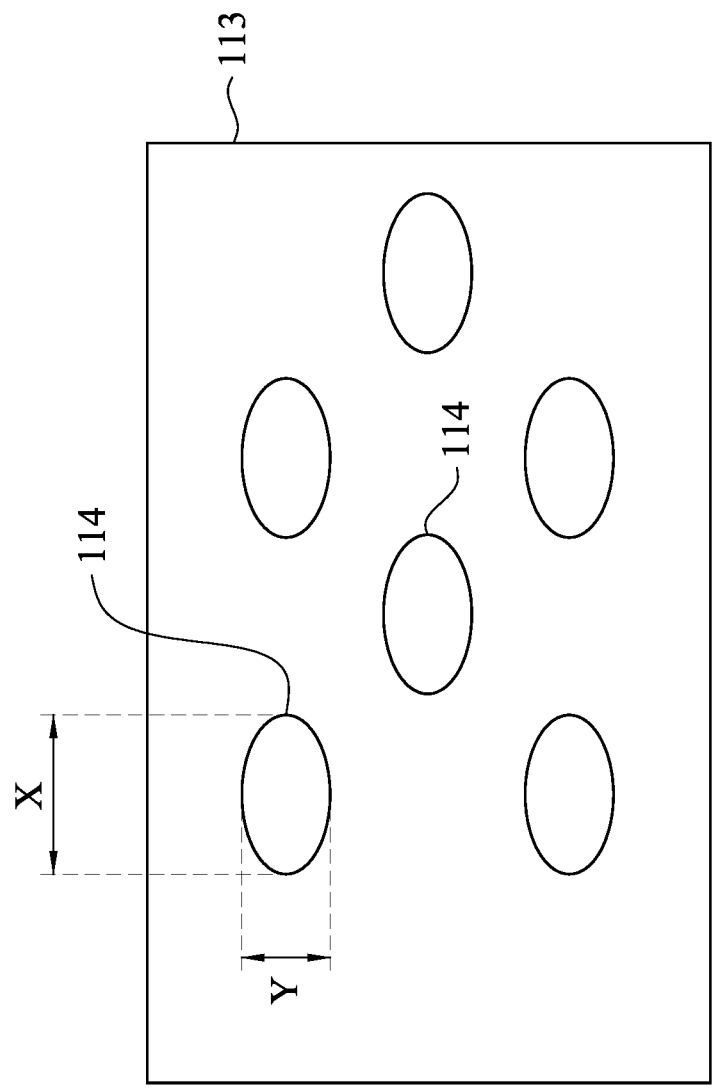

Next, in FIG. 23A, a second ILD 113 is formed over the first ILD 90. The second ILD 113 may be formed of a same or similar material as the first ILD 90 by a same or similar formation method, thus details are not repeated. Next, an opening 114 is formed over the metal gate structure 97. The opening 114 extends through the second ILD 113, the second material 99, and the first material 93 to expose the capping layer 91. The numbers of the openings 114 and the locations of the openings 114 in FIGS. 23A and 23B are for illustration purpose only and not limiting.

In some embodiments, to form the opening 114, two etching processes (e.g., anisotropic etching processes such as plasma etching processes) are performed sequentially. For example, a first etching process may be performed using a first process gas that is selective to (e.g., having a higher etching rate for) the second material 99. In other words, the first etching process is performed to remove the second material 99. After the first etching process is finished, a second etching process may be performed using a second process gas that is selective to the first material 93. In other words, the second etching process is performed to remove the first material 93. In some embodiments, the first process gas is a mixture of $BCl_3$, $Cl_2$, and a carrier gas, where the carrier gas may be, e.g., He, Ne, Ar, Kr, or Xe. In some embodiments, the second process gas is a mixture of HBr, $Cl_2$, and a carrier gas, where the carrier gas may be, e.g., He, Ne, Ar, Kr, or Xe. For both the first etching process and the second etching process, an etching selectivity larger than 6 between the materials (e.g., $ZrO_2$ or Si) of the bi-layered helmet 92 and the surrounding material (e.g., SiN) is achieved at corner regions near the shoulders (e.g., top corners) of the metal gate structure 97.

FIG. 23A shows an example where the opening 114 is misaligned (e.g., off-center) with the metal gate structure 97, such that the opening 114 also exposes the underlying gate spacer 87 and the CESL 89. In the example of FIG. 23A, due to the etching process to form the opening 114, the upper surface 89UB of the CESL 89 under the opening 114 is shown to be lower (e.g., closer to the substrate 50) than the upper surface 89UA covered by the second material 99, and a portion of the dielectric layer 111 under the opening 114 is shown to be removed such that the dielectric layer 111 has a step shape at the top left corner. It should be understood that the vertical offset between the upper surfaces 89UA and 89UB, as well as the step shape at the top left corner of the dielectric layer 111, are exaggerated in FIG. 23A, since the excellent etching selectivity achieved by the etching process removes only very small amount of the exposed CESL 89L and the exposed dielectric layer 111. In other words, due to the excellent etching selectivity achieved, the etching process removes portions of the bi-layered helmet 92 underlying the opening 114 without substantially attacking the other exposed structures. As a result, a similar "shoulder loss" problem, where portions of the gate spacer 87, the CESL 89, and the barrier layer 105 near the upper corner of the metal gate structure 97 are etched away by the etching process, is avoided or reduced. Therefore, the excellent etching selectivity achieved by the bi-layered helmet 92 allows the openings 114 to be formed in a self-aligned manner, which allows the width X of the opening 114 (e.g., measured along the longitudinal axis of the fin 64) to be larger than the width Y of the opening 114 (see FIG. 23B, e.g., measured along a direction perpendicular to the longitudinal axis of the fin 64 and parallel to the major upper surface of the substrate 50). More details are discussed below with reference to FIG. 23B.

FIG. 23B illustrates the top view of a portion of the FinFET device 100. For simplicity, not all features of the FinFET device 100 are shown in FIG. 23B. In addition, FIG. 23B illustrates additional openings 114 not illustrated in FIG. 23A. As illustrated in FIG. 23B, the width X of the opening 114 is larger than the width Y of the opening 114. The increased dimension for the width X allows for a larger volume of the opening 114, which in turn allows for a larger volume for the subsequently formed via 115 (see FIG. 25).

Figure 24:
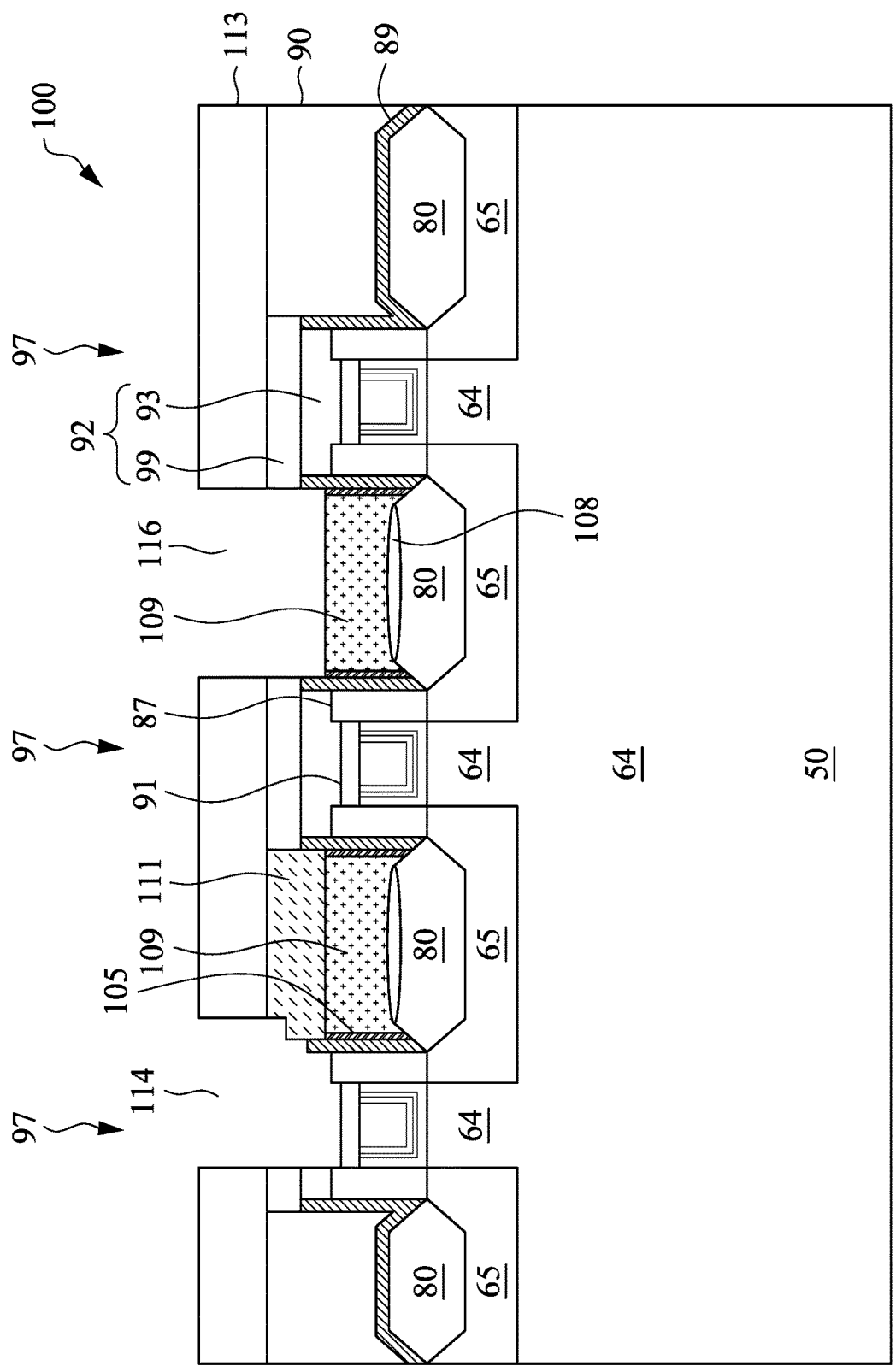

Next, in FIG. 24, an opening 116 is formed to expose the source/drain contact 109. The opening 116 extends through the second ILD 113 and the dielectric layer 111 under the second ILD 113. In the example of FIG. 24, the dielectric layer 111 under the opening 116 is completely removed. The numbers of the openings 116 and the locations of the openings 116 in FIG. 24 are for illustration purpose only and not limiting.

In some embodiments, to form the opening 116, an etching process (e.g., an anisotropic etching process such as a plasma etching process) is performed using a process gas comprising carbohydro fluoride (e.g., $C_xH_yF_z$, such as $CH_2F_2$ or $CH_3F$) and hydrogen (e.g, $H_2$). In some embodiments, to form the opening 116, an etching process that includes multiple etching cycles is performed, where in each of the etching cycles, a first plasma process (e.g., an etching process) using the process gas comprising $C_xH_yF_z$ and $H_2$ is performed under a pulsing plasma condition, then a second plasma process (e.g., a post treatment process) is performed using $H_2$ plasma. A high etching selectivity of larger than 6 is achieved between the material (e.g., SiN) of the dielectric layer 111 and the materials (e.g., $ZrO_2$ and Si) of the bi-layered helmet 92 at corner regions near the shoulders (e.g., top corners) of the source/drain contact 109. The excellent etching selectivity achieved allows the opening 116 to be formed in a self-aligned manner.

Figure 25:
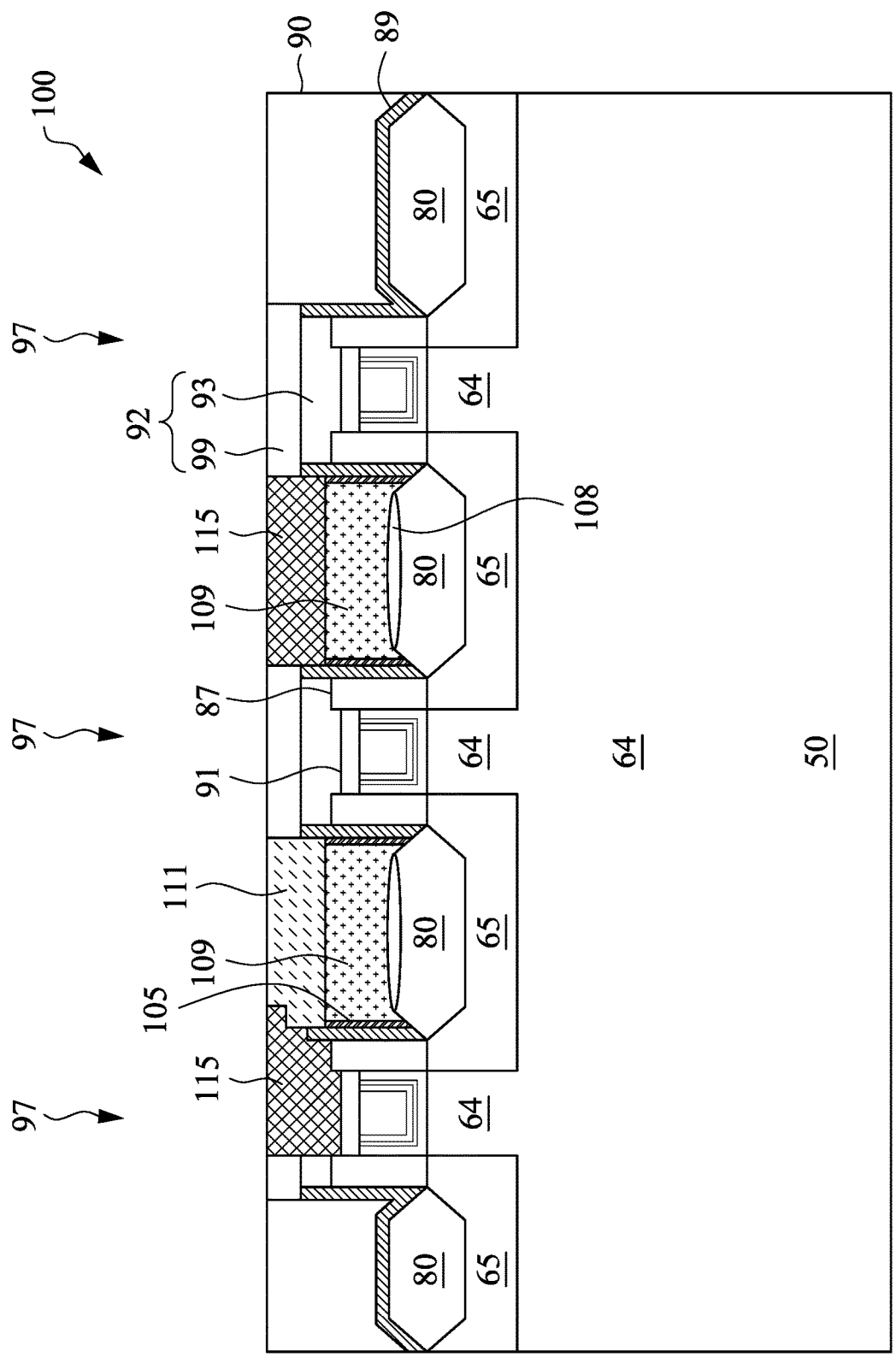

Next, in FIG. 25, a conductive material 115 is formed to fill the openings 114 and 116. The conductive material 115 may be, e.g., ruthenium, tungsten, or the like, and may be formed by, PVD, CVD, ALD, or the like. After the conductive material 115 is formed, a planarization process, such as CMP, is performed to remove excess portions of the conductive material 115. After the planarization process, the first ILD 90, the second material 99, the dielectric layer 111, and the conductive material 115 have a coplanar upper surface. The remaining portions of the conductive material 115 in the openings 114 and 116 form vias 115. In the example of FIG. 25, the via 115 over the metal gate structure 97 contacts (e.g., physically contacts) the capping layer 91, and is electrically coupled to the metal gate structure 97 through the capping layer 91. The via 115 over the source/drain contact 109 contacts (e.g., physically contacts) the source/drain contact 109.

Figure 26:
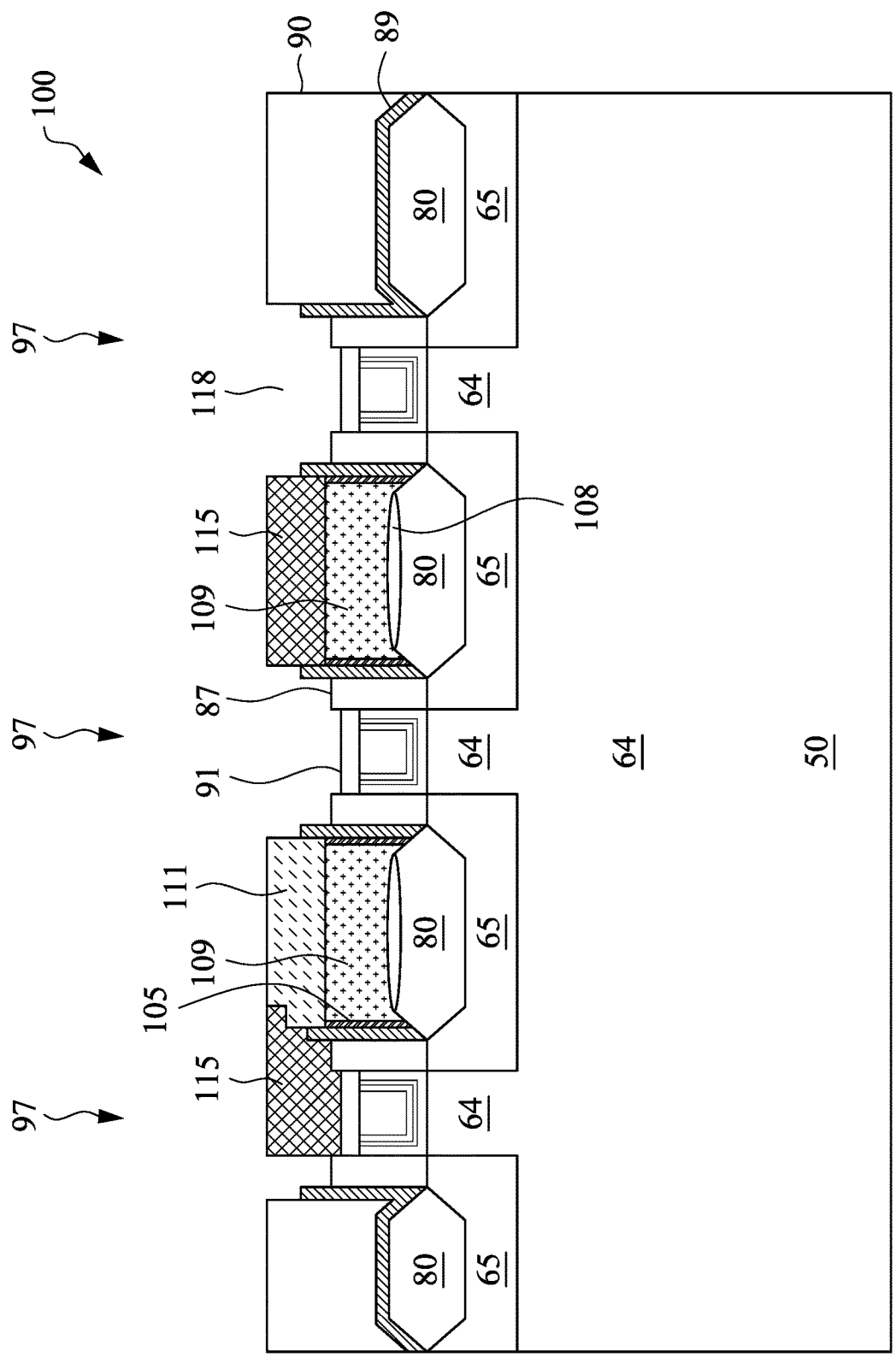

Next, in FIG. 26, the bi-layered helmets 92 are removed to form recesses 118 in the first ILD 90. In some embodiments, to remove the bi-layered helmets 92, an etching process is performed using an etching gas selective to the materials (e.g., $ZrO_2$, Si) of the bi-layered helmets 92. For example, an etching selectivity of larger than 10 is achieved by using an etching gas that comprises HBr, $Cl_2$, $CH_4$, $BCl_3$, Ar, or combinations thereof. For example, the etching gas may be a mixture of HBr, $BCl_3$, and Ar, a mixture of HBr, $Cl_2$, $BCl_3$, and Ar, or a mixture of $Cl_2$, $BCl_3$, $CH_4$, and Ar. The etching process selectively removes the bi-layered helmets 92 without substantially attacking the materials (e.g., Ru, W, SiN, or SiO) of the surrounding structures.

Figure 27:
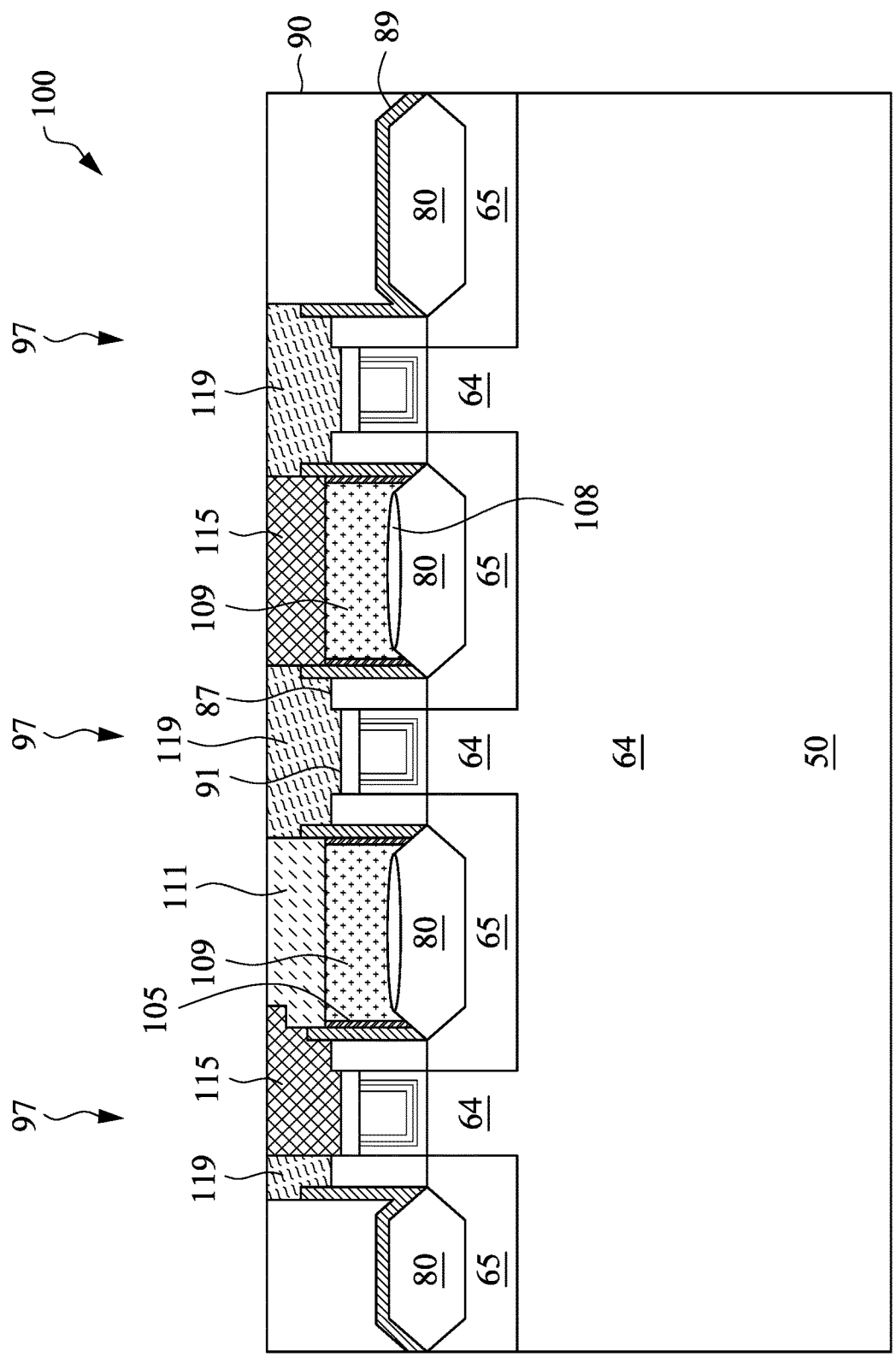

Next, in FIG. 27, a low-k dielectric material 119 (e.g., having a dielectric constant smaller than about 3.9, or smaller) is formed to fill the recesses 118 in FIG. 26. A planarization process, such as CMP, may be performed to remove excess portions of the low-k dielectric material 119 that are outside of the recesses 118. In other words, the bi-layered helmets 92 are replaced with the low-k dielectric material 119, which has a k value smaller than the k values of materials of the bi-layered helmets 92, or smaller than the average k value of the materials of the bi-layered helmets 92. The low-k dielectric material 119 may be, e.g., carbon doped oxides, porous carbon doped silicon dioxide, or the like, and may be formed by CVD, ALD, or the like. The low-k dielectric material 119 may advantageously reduce the RC delay of the device formed.

Additional processing may follow the processing of FIG. 27 to complete the fabrication of the FinFET device 100. For example, an interconnect structure, which includes a plurality of dielectric layers and conductive features (e.g., vias, conductive lines) in the dielectric layers, is formed over the structure of FIG. 27 to interconnect the electrical components to form functional circuits. Details are not discussed here.

Embodiments may achieve advantages. For example, the present disclosure uses a bi-layered helmet over the gate structure to reduce or prevent the "shoulder loss" problem when forming self-aligned source/drain contacts, thus preventing electrical short between the gate structures and the source/drain regions. Due to the excellent etch selectivity provided by the bi-layered helmet, vias over the gate structure and over the self-aligned source/drain contact may also be formed in a self-aligned manner. By replacing the bi-layered helmet with a low-k dielectric material, the RC delay of the device formed is reduced.

Figure 28:
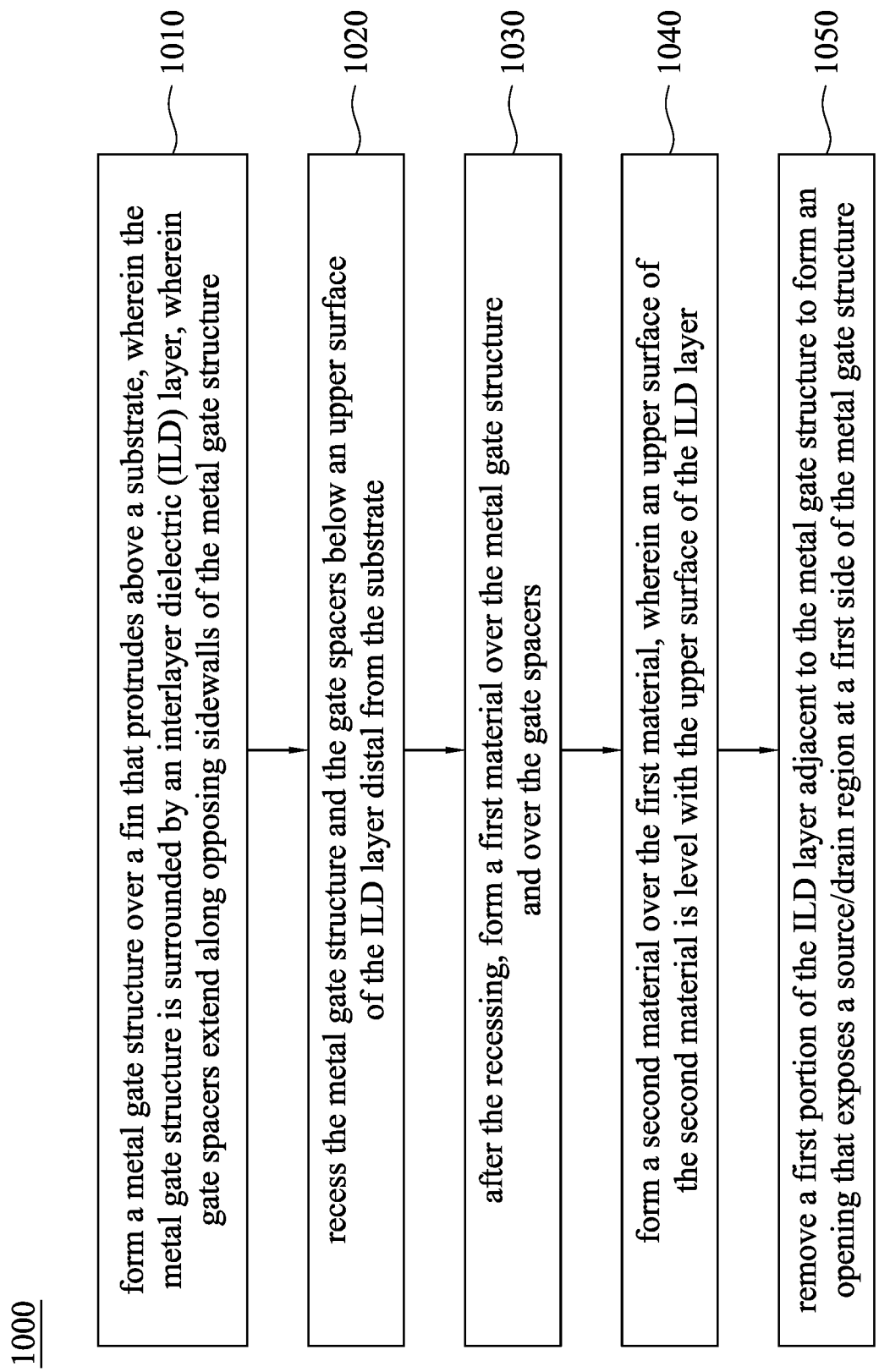
FIG. 28 illustrates a flow chart of a method of fabricating a semiconductor device, in accordance with some embodiments.

FIG. 28 illustrates a flow chart of a method 1000 of fabricating a semiconductor device, in accordance with some embodiments. It should be understood that the embodiment method 1000 shown in FIG. 28 is merely an example of many possible embodiment methods. One of ordinary skill in the art would recognize many variations, alternatives, and modifications. For example, various steps as illustrated in FIG. 28 may be added, removed, replaced, rearranged and repeated.

Referring to FIG. 28, at block 1010, a metal gate structure is formed over a fin that protrudes above a substrate, wherein the metal gate structure is surrounded by an interlayer dielectric (ILD) layer, wherein gate spacers extend along opposing sidewalls of the metal gate structure. At block 1020, the metal gate structure and the gate spacers are recessed below an upper surface of the ILD layer distal from the substrate. At block 1030, after the recessing, a first material is formed over the metal gate structure and over the gate spacers. At block 1040, a second material is formed over the first material, wherein an upper surface of the second material is level with the upper surface of the ILD layer. At block 1050, a first portion of the ILD layer adjacent to the metal gate structure is removed to form an opening that exposes a source/drain region at a first side of the metal gate structure.

In an embodiment, a method of forming a semiconductor device includes: forming a metal gate structure over a fin that protrudes above a substrate, wherein the metal gate structure is surrounded by an interlayer dielectric (ILD) layer, wherein gate spacers extend along opposing sidewalls of the metal gate structure; recessing the metal gate structure and the gate spacers below an upper surface of the ILD layer distal from the substrate; after the recessing, forming a first material over the metal gate structure and over the gate spacers; forming a second material over the first material, wherein an upper surface of the second material is level with the upper surface of the ILD layer; and removing a first portion of the ILD layer adjacent to the metal gate structure to form an opening that exposes a source/drain region at a first side of the metal gate structure. In an embodiment, removing the first portion of the ILD layer comprises performing an etching process, wherein the first material has a first etching rate for the etching process, wherein the second material has a second etching rate for the etching process, the second etching rate being smaller than the first etching rate. In an embodiment, the first material comprises silicon, and the second material comprises a metal oxide. In an embodiment, the first material is silicon or silicon carbide, and the second material is zirconium oxide or aluminum oxide. In an embodiment, removing the first portion of the ILD layer comprises performing the etching process using an etching gas that comprises fluorocarbon. In an embodiment, recessing the metal gate structure and the gate spacers comprises: etching back the metal gate structure using a first etching process; after etching back the metal gate structure, recessing the gate spacers using a second etching process; and after recessing the gate spacers, etching back the metal gate structure again using a third etching process, wherein after the third etching process, an upper surface of the metal gate structure distal from the substrate is closer to the substrate than an upper surface of the gate spacers distal from the substrate. In an embodiment, the method further includes, after the third etching process and before forming the first material, forming a capping layer on the upper surface of the metal gate structure. In an embodiment, recessing the metal gate structure and the gate spacers forms a recess in the ILD layer, wherein the recess exposes a contact etch stop layer (CESL) disposed between the gate spacers and the ILD layer, wherein forming the first material comprises: filling the recess with the first material; performing a planarization process after filling the recess; and after the planarization process, removing an upper portion of the first material in the recess to expose the CESL. In an embodiment, forming the second material comprises: after removing the upper portion of the first material, recessing an upper surface of the CESL below the upper surface of the ILD layer; and forming the second material over an upper surface of first material, over an upper surface of the gate spacers, and over the upper surface of the CESL. In an embodiment, the method includes, after removing the first portion of the ILD layer, filling the opening with a first conductive material to form a source/drain contact over and electrically coupled to the source/drain region. In an embodiment, the method further includes, after filling the opening: replacing an upper portion of the source/drain contact with a dielectric material; forming a first opening over the metal gate structure, wherein the first opening extends through the first material and the second material; forming a second opening over the source/drain contact by removing at least portions of the dielectric material, wherein the second opening exposes the source/drain contact; and filling the first opening and the second opening with a second conductive material. In an embodiment, the method further includes: after filling the first opening and the second opening, replacing remaining portions of the first material and the second material with a low-k dielectric material.

In an embodiment, a method of forming a semiconductor device includes: recessing a gate structure below an upper surface of a dielectric layer that surrounds the gate structure; after recessing the gate structure, recessing gate spacers on sidewalls of the gate structure below the upper surface of the dielectric layer, wherein recessing the gate spacers exposes sidewalls of a contact etch stop layer (CESL) that is disposed between the dielectric layer and the gate spacers; forming a first material over the recessed gate structure, over the recessed gate spacers, and between the sidewalls of the CESL, wherein an upper surface of the first material is recessed from the upper surface of the dielectric layer; forming a second material different from the first material over the first material, wherein an upper surface of the second material is level with the upper surface of the dielectric layer; forming an opening in the dielectric layer adjacent to the gate structure by etching a portion of the dielectric layer, wherein the opening exposes a source/drain region adjacent to the gate structure; and filling the opening with a first conductive material to form a source/drain contact. In an embodiment, the method further includes, after forming the first material and before forming the second material: recessing the CESL below the upper surface of the dielectric layer, wherein the second material is formed over an upper surface of the CESL and over the upper surface of the first material. In an embodiment, forming the opening comprises: forming a patterned mask layer over the second material and over the dielectric layer, wherein an opening of the patterned mask layer is directly over the source/drain region and at least a portion of the second material; and performing an etching process using the patterned mask layer as an etching mask, wherein etching process uses an etchant that is selective to the dielectric layer. In an embodiment, the method further includes, after filling the opening: forming a recess in the dielectric layer over the recessed gate structure, wherein forming the recess comprises: performing a first etching process using a first etchant selective to the second material; and performing a second etching process using a second etchant selective to the first material; and filling the recess with a second conductive material to form a via over and electrically coupled to the gate structure. In an embodiment, the method further includes, after filling the recess: removing the first material and the second material; and filling voids left by the removed first material and the removed second material using a low-k dielectric material.

In an embodiment, a method of forming a semiconductor device includes: forming a gate structure over a fin that protrudes above a substrate, wherein the gate structure is surrounded by a dielectric layer; recessing the gate structure and gate spacers of the gate structure below an upper surface of the dielectric layer, wherein after the recessing, sidewalls of a contact etch stop layer (CESL) disposed between the dielectric layer and the gate spacers are exposed; after the recessing, partially filling a recess between the sidewalls of the CESL by forming a first material on the gate structure and on the gate spacers; after forming the first material, recessing the CESL below the upper surface of the dielectric layer; after recessing the CESL, filling the recess by forming a second material different from the first material on the first material and on the CESL; and after forming the second material, etching the dielectric layer to form an opening in the dielectric layer adjacent to the gate structure, wherein the opening exposes a source/drain region adjacent to the gate structure. In an embodiment, the method further includes filling the opening with a conductive material to form a source/drain contact. In an embodiment, the first material is silicon, and the second material is an oxide of a metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a metal gate structure over a fin that protrudes above a substrate, wherein the metal gate structure is surrounded by an interlayer dielectric (ILD) layer, wherein gate spacers extend along opposing sidewalls of the metal gate structure;
    recessing the metal gate structure and the gate spacers below an upper surface of the ILD layer distal from the substrate, wherein recessing the metal gate structure and the gate spacers comprises:
        etching back the metal gate structure using a first etching process;
        after etching back the metal gate structure, recessing the gate spacers using a second etching process; and
        after recessing the gate spacers, etching back the metal gate structure again using a third etching process, wherein after the third etching process, an upper surface of the metal gate structure distal from the substrate is closer to the substrate than an upper surface of the gate spacers distal from the substrate;
    after the recessing, forming a first material over the metal gate structure and over the gate spacers;

after forming the first material, forming a second material over the first material, wherein an upper surface of the second material is level with the upper surface of the ILD layer;

removing a first portion of the ILD layer adjacent to the metal gate structure to form a first opening that exposes a source/drain region at a first side of the metal gate structure;

filling the first opening with a first conductive material to form a source/drain contact;

after filling the first opening, forming a gate contact over and electrically coupled to the metal gate structure, wherein the gate contact extends through the first material and the second material;

after forming the gate contact, removing the first material and the second material to form a second opening in the ILD layer; and filling the second opening with a low-k dielectric material.

2. The method of claim 1, wherein removing the first portion of the ILD layer comprises performing an etching process, wherein the first material has a first etching rate for the etching process, wherein the second material has a second etching rate for the etching process, the second etching rate being smaller than the first etching rate.

3. The method of claim 2, wherein the first material comprises silicon, and the second material comprises a metal oxide.

4. The method of claim 3, wherein the first material is silicon or silicon carbide, and the second material is zirconium oxide or aluminum oxide.

5. The method of claim 1, further comprising, after the third etching process and before forming the first material, forming a capping layer on the upper surface of the metal gate structure.

6. The method of claim 1, wherein recessing the metal gate structure and the gate spacers forms a recess in the ILD layer, wherein the recess exposes a contact etch stop layer (CESL) disposed between the gate spacers and the ILD layer, wherein forming the first material comprises:

filling the recess with the first material;

performing a planarization process after filling the recess, wherein the planarization process achieves a coplanar upper surface for the ILD layer, the CESL, and the first material; and after the planarization process, selectively removing an upper portion of the first material in the recess to expose sidewalls of the CESL facing the first material.

7. The method of claim 6, wherein forming the second material comprises:

after selectively removing the upper portion of the first material, recessing an upper surface of the CESL below the upper surface of the ILD layer; and forming the second material over an upper surface of the first material, over an upper surface of the gate spacers, and over the upper surface of the CESL.

8. The method of claim 1, wherein the second opening exposes a sidewall of a contact etch stop layer (CESL) disposed between the gate spacers and the ILD layer, exposes an upper surface of the CESL distal from the substrate, and exposes a sidewall of the gate contact.

9. The method of claim 1, further comprising, after forming the source/drain contact and before filling the second opening:

recessing the source/drain contact below the upper surface of the ILD layer; and forming a dielectric material in the ILD layer over the source/drain contact, wherein an upper surface of the dielectric material is level with the upper surface of the ILD layer.

10. The method of claim 9, further comprising:

forming a third opening in the dielectric material to expose the source/drain contact; and filling the third opening with a second conductive material.

11. A method of forming a semiconductor device, the method comprising:

recessing a gate structure below an upper surface of a dielectric layer that surrounds the gate structure;

after recessing the gate structure, recessing gate spacers on sidewalls of the gate structure below the upper surface of the dielectric layer, wherein recessing the gate spacers exposes sidewalls of a contact etch stop layer (CESL) that is disposed between the dielectric layer and the gate spacers;

after recessing the gate spacers, recessing the gate structure again;

after recessing the gate structure again, forming a first material over the recessed gate structure, over the recessed gate spacers, and between the sidewalls of the CESL, wherein an upper surface of the first material is recessed from the upper surface of the dielectric layer;

after forming the first material, forming a second material different from the first material over the first material, wherein an upper surface of the second material is level with the upper surface of the dielectric layer;

forming an opening in the dielectric layer adjacent to the gate structure by etching a portion of the dielectric layer, wherein the opening exposes a source/drain region adjacent to the gate structure; and filling the opening with a first conductive material to form a source/drain contact.

12. The method of claim 11, further comprising, after forming the first material and before forming the second material:

recessing the CESL below the upper surface of the dielectric layer, wherein the second material is formed over an upper surface of the CESL and over the upper surface of the first material.

13. The method of claim 11, wherein forming the opening comprises:

forming a patterned mask layer over the second material and over the dielectric layer, wherein an opening of the patterned mask layer is directly over the source/drain region and at least a portion of the second material; and performing an etching process using the patterned mask layer as an etching mask, wherein the etching process uses an etchant that is selective to the dielectric layer.

14. The method of claim 11, further comprising, after filling the opening:

forming a recess in the dielectric layer over the recessed gate structure, wherein the recess exposes an upper surface of the gate spacers distal from a substrate of the semiconductor device, exposes a first sidewall of the CESL, and exposes a first upper surface of the CESL distal from the substrate; and filling the recess with a second conductive material to form a via over and electrically coupled to the gate structure, wherein the via contacts the upper surface of the gate spacers, the first sidewall of the CESL, and the first upper surface of the CESL.

15. The method of claim 14, further comprising, after filling the recess:

removing the first material and the second material to form a void in the dielectric layer, wherein the void exposes a second upper surface of the CESL and a second sidewall of the CESL, and exposes a sidewall of the via; and filling the voids left by the removed first material and the removed second material using a low-k dielectric material, wherein the low-k dielectric material contacts the second upper surface of the CESL, the second sidewall of the CESL, and the sidewall of the via.

16. A method of forming a semiconductor device, the method comprising:

forming a gate structure over a fin that protrudes above a substrate, wherein the gate structure is surrounded by a dielectric layer;

recessing the gate structure and gate spacers of the gate structure below an upper surface of the dielectric layer while keeping an upper surface of a contact etch stop layer (CESL) level with the upper surface of the dielectric layer, wherein the CESL is disposed between the dielectric layer and the gate spacers, wherein after the recessing, sidewalls of the CESL are exposed;

after the recessing, partially filling a first recess between the sidewalls of the CESL by forming a first material on the gate structure and on the gate spacers while keeping the upper surface of the CESL level with the upper surface of the dielectric layer;

after forming the first material, recessing the upper surface of the CESL below the upper surface of the dielectric layer;

after recessing the CESL, filling the first recess by forming a second material different from the first material on the first material and on the CESL;

after forming the second material, etching the dielectric layer to form an opening in the dielectric layer adjacent to the gate structure, wherein the opening exposes a source/drain region adjacent to the gate structure;

filling the opening with a conductive material to form a source/drain contact;

after forming the source/drain contact, forming a via that extends through the first material and the second material to electrically couple to the gate structure;

after forming the via, removing the first material and the second material to form a second recess in the dielectric layer; and filling the second recess with a low-k dielectric material.

17. The method of claim 16, wherein the first material is silicon, and the second material is an oxide of a metal.

18. The method of claim 16, wherein the second recess in the dielectric layer exposes a first sidewall of the CESL, a first upper surface of the CESL distal from the substrate, and a sidewall of the via, wherein after filling the second recess, the low-k dielectric material contacts the first sidewall of the CESL, the first upper surface of the CESL, and the sidewall of the via.

19. The method of claim 18, wherein forming the via comprises:

forming another opening in the dielectric layer over the gate structure, wherein the another opening exposes a second sidewall of the CESL and a second upper surface of the CESL distal from the substrate; and filling the another opening with another conductive material to form the via, wherein the via contacts the second sidewall of the CESL and the second upper surface of the CESL.

20. The method of claim 16, wherein partially filling the first recess comprises:

forming the first material in the first recess and over the upper surface of the dielectric layer;

performing a planarization process to remove the first material from the upper surface of the dielectric layer; and after performing the planarization process, selectively recessing the first material below the upper surface of the dielectric layer.

* * * * *